United States Patent
Yun et al.

(10) Patent No.: US 7,265,418 B2
(45) Date of Patent: Sep. 4, 2007

(54) SEMICONDUCTOR DEVICES HAVING FIELD EFFECT TRANSISTORS

(75) Inventors: Eun-Jung Yun, Seoul (KR); Hye-Jin Cho, Gyeonggi-do (KR); Dong-Won Kim, Gyeonggi-do (KR); Sung-Min Kim, Incheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 11/030,770

(22) Filed: Jan. 5, 2005

(65) Prior Publication Data

US 2005/0158934 A1 Jul. 21, 2005

(30) Foreign Application Priority Data

Jan. 6, 2004 (KR) .................. 10-2004-0000605

(51) Int. Cl.
*H01L 27/01* (2006.01)
*H01L 21/84* (2006.01)

(52) U.S. Cl. .............. 257/347; 257/351; 257/410; 257/E21.345; 438/157; 438/283

(58) Field of Classification Search ........ 257/347–349, 257/302, 315; 438/142, 157, 197–199
See application file for complete search history.

(56) References Cited

U.S. PATENT DOCUMENTS 6,252,284 B1 6/2001 Muller et al.
6,413,802 B1 7/2002 Hu et al.
6,858,478 B2 * 2/2005 Chau et al. .................. 438/149
2004/0075122 A1 * 4/2004 Lin et al. .................... 257/288

FOREIGN PATENT DOCUMENTS

JP 2003-204068 7/2003
KR 2003-0065631 8/2003

OTHER PUBLICATIONS

English language abstract of the Korean Publication No. 2003-0065631.
English language abstract of the Japanese Publication No. 2003-204068.
Yang, et al. "35nm CMOS FinFETs" IEEE 2002 Symposium On VLSI Technology Digest of Technical Paper, pp. 104-105.

* cited by examiner

*Primary Examiner*—Dung A. Le
(74) *Attorney, Agent, or Firm*—Marger Johnson & McCollom, P.C.

(57) ABSTRACT

A semiconductor device having a field effect transistor and a method of fabricating the same. In-situ doped epitaxial patterns are respectively formed at both sidewalls of a protruded channel pattern from a substrate by performing an in-situ doped epitaxial growth process. The in-situ doped epitaxial pattern has a conformal impurity concentration throughout. Accordingly, source/drain regions with a conformal impurity concentration are connected throughout a channel width of a channel region including both sidewalls of a protruded channel pattern. As a result, it is possible to maximize a driving current of the filed effect transistor, and an on-off characteristic can be highly stabilized.

7 Claims, 23 Drawing Sheets

SEMICONDUCTOR DEVICES HAVING FIELD EFFECT TRANSISTORS

This application claims priority from Korean Patent Application No. 2004-00605, filed on Jan. 6, 2004, the contents of which is herein incorporated by reference in its entirety.

BACKGROUND OF THE INVENTION

1. Field of the Invention

This invention generally relates to semiconductor devices and methods of fabricating the same and, more specifically, to a semiconductor device having a field effect transistor (hereinafter referred to as "transistor") and a method of fabricating the same.

2. Description of the Related Art

As a design rule is scaled down due to high-integration of semiconductor devices, many problems occur in planar transistors having horizontal channels so that there is a limitation to scaling down the size of the planar transistors. A short channel effect and a drain induced barrier lowering (DIBL) characteristic are exacerbated with scaling down of the planar transistors.

On the other hand, due to recent trends towards high integration of semiconductor devices, transistors continue to become smaller, yet require fast speed. Thus, there is a need to increase a driving current of transistors. In other words, with high-integration and high-speed of the semiconductor devices, a transistor having both a small size and a large driving current has in high demand.

Recently, in order to solve these problems, FinFET is disclosed in "2002 Symposium On VLSI Technology Digest of Technical Paper" entitled in "35 nm CMOS FinFETs" by Fu-Liang Yang et al. According to this, a gate electrode crossing a fin formed in a buried oxide layer of a silicon-on-insulator (SOI) substrate is formed. Impurity ions are implanted using a gate electrode as a mask. As a result, source/drain regions are formed in the fin at both sides of the gate electrode.

In the above-mentioned method, the source/drain regions are formed by an impurity implantation method. Now that impurities are implanted using an average projection range, the concentration of impurities may not be conformal according to the depth of the fin. In addition, since impurities are diffused randomly due to a thermal process for activation, the channel length may be changed according to a position. In addition, since the concentration of impurities is changed according to a position, the resistance of source/drain regions may be changed depending on the position. As a result, a current amount may be changed by a position of a channel region. If these phenomena are present, the channel length may be shortened because a channel is formed at only a portion of the channel region. That is, the driving current amount of transistors may be reduced. Additionally, if the channel lengths of the channel region are not constant, a leakage current may occur under a threshold voltage, and a channel region that requires a higher threshold voltage may exist. Therefore, on-off characteristic of transistors may be degraded.

SUMMARY OF THE INVENTION

The semiconductor device according to one embodiment of the invention may include a protruded channel pattern vertically extended from a substrate, and having a pair of first sidewalls facing each other, and a pair of second sidewalls facing each other. A pair of in-situ doped epitaxial patterns are formed on the first sidewalls, respectively. A pair of conductive patterns respectively formed on one sidewall of the in-situ doped epitaxial patterns are placed opposite the protruded channel pattern. The gate electrode crosses the protruded channel pattern, and a gate insulating layer is interposed between the gate electrode and the protruded channel pattern.

A semiconductor device according to another embodiment of the invention may include a protruded channel pattern vertically extended from a substrate and a separated channel pattern vertically isolated from the protruded channel pattern. The protruded channel pattern has a pair of first sidewalls facing each other and a pair of second sidewalls facing each other. The separated channel pattern has a pair of third sidewalls aligned with the first sidewalls and a pair of fourth sidewalls aligned with the second sidewalls. A pair of in-situ doped epitaxial patterns are placed. Each of the in-situ doped epitaxial patterns is extended to be formed on the third sidewalls. A pair of conductive patterns, which are formed on one sidewall of the in-situ doped epitaxial patterns opposite the protruded and separated channel patterns, are placed. A gate electrode crosses the protruded and separated channel patterns. A gate insulating layer is interposed between gate electrode and the protruded channel pattern, and between the gate electrode and the separated channel pattern.

In another embodiment, a method of fabricating a semiconductor device having a transistor may include forming a protruded channel pattern vertically extended from a substrate. A pair of in-situ doped epitaxial patterns are formed at both sidewalls of the protruded channel pattern by performing an in-situ doped selective epitaxial growth (SEG) process, respectively. A pair of conductive patterns are formed at one sidewall of the in-situ doped epitaxial patterns opposite the protruded channel pattern, respectively. A gate electrode, which crosses the protruded channel pattern and intervenes a gate insulating layer, is formed.

A method of fabricating a semiconductor device according to another embodiment of the present invention may include forming a protruded channel pattern vertically extended from a substrate, a channel interlayer pattern stacked on the protruded channel pattern, and a separated channel pattern. A pair of in-situ doped epitaxial patterns are formed on substantially the entire surface at both sidewall of the protruded channel pattern, the channel interlayer pattern, and the separated channel patterns by performing the in-situ doped SEG process, respectively. A pair of conductive patterns are formed on sidewalls of the in-situ doped epitaxial patterns opposite the protruded channel pattern, the channel interlayer pattern, and the separated channel pattern, respectively. A gate electrode is formed which crosses the protruded channel pattern, the channel interlayer pattern, and separated channel patterns, and intervenes a gate insulating layer.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

BRIEF DESCRIPTION OF THE DRAWINGS

FIGS. 4A to 9A are cross-sectional views taken along line I-I' of FIG. 1 for illustrating a method of fabricating the semiconductor device according to one embodiment of the present invention.

FIGS. 4B to 9B are cross-sectional views taken along line II-II' of FIG. 1 for illustrating a method of fabricating the semiconductor device according to one embodiment of the present invention.

FIGS. 15A to 19A are cross-sectional views taken along line III-III' of FIG. 10 for illustrating a method of fabricating the semiconductor device according to another embodiment of the present invention.

FIGS. 15B to 19B are cross-sectional views taken along line IV-IV' of FIG. 10 for illustrating the method of fabricating the semiconductor device according to another embodiment of the present invention.

FIGS. 25A to 27A are cross-sectional views taken along line V-V' of FIG. 20 for illustrating a method of fabricating the semiconductor device according to still another embodiment of the present invention.

FIGS. 25B to 27B are cross-sectional views taken along line VI-VI' of FIG. 20 for illustrating the method of fabricating the semiconductor device according to still another embodiment of the present invention.

DETAILED DESCRIPTION OF THE PREFERRED EMBODIMENTS

Figure 1:
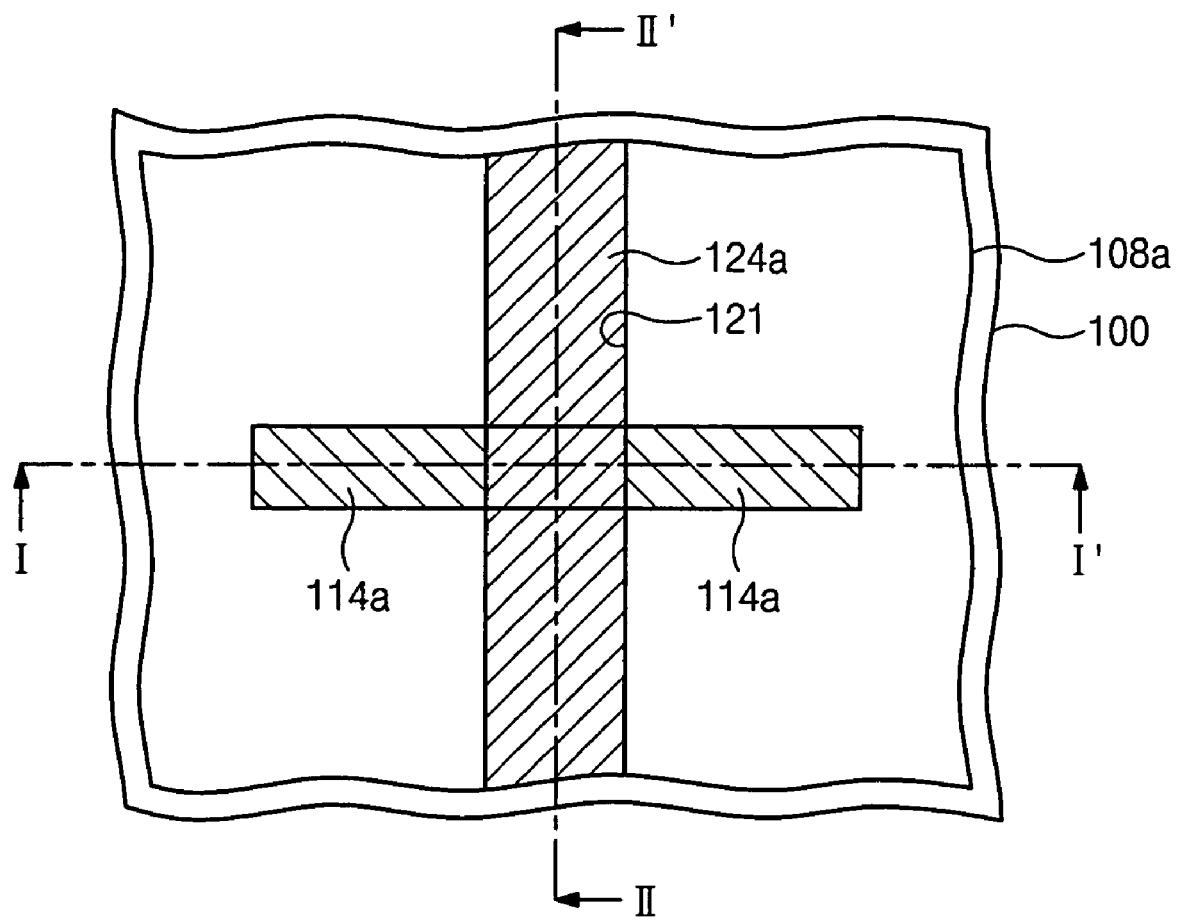
FIG. 1 is a plan view showing a semiconductor device according to one embodiment of the present invention.
Figure 2:
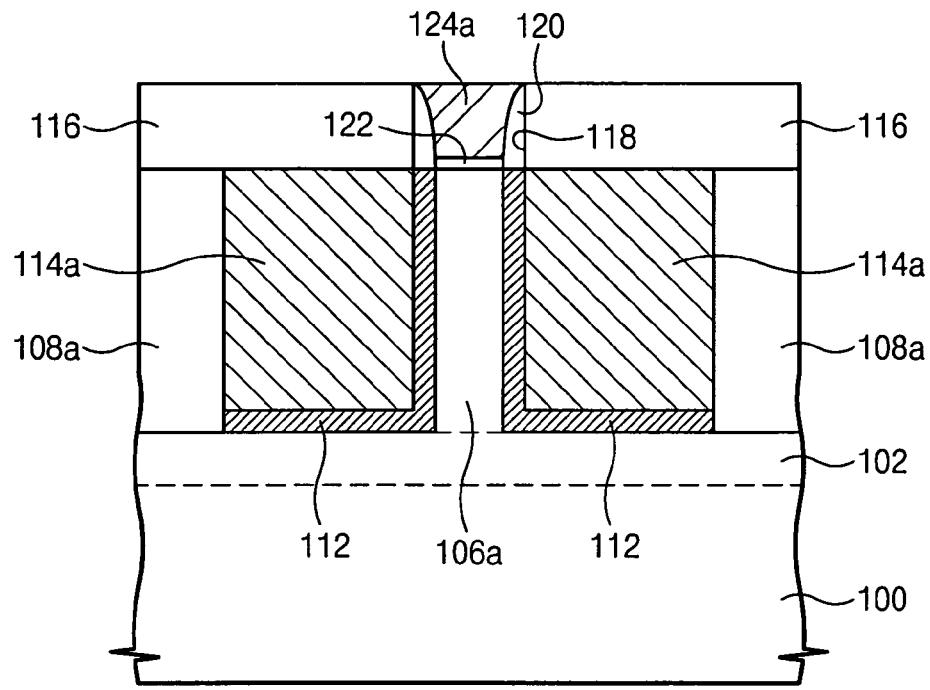
FIGS. 2 and 3 are cross-sectional views taken along line I-I' and II-II' of FIG. 1, respectively.
Figure 3:
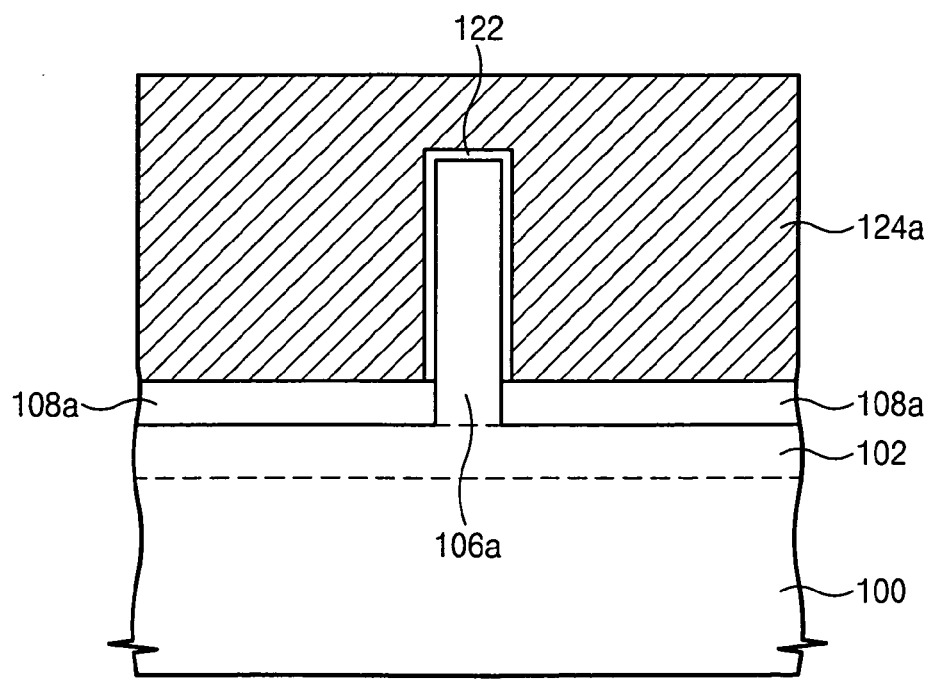
Figure 4A:
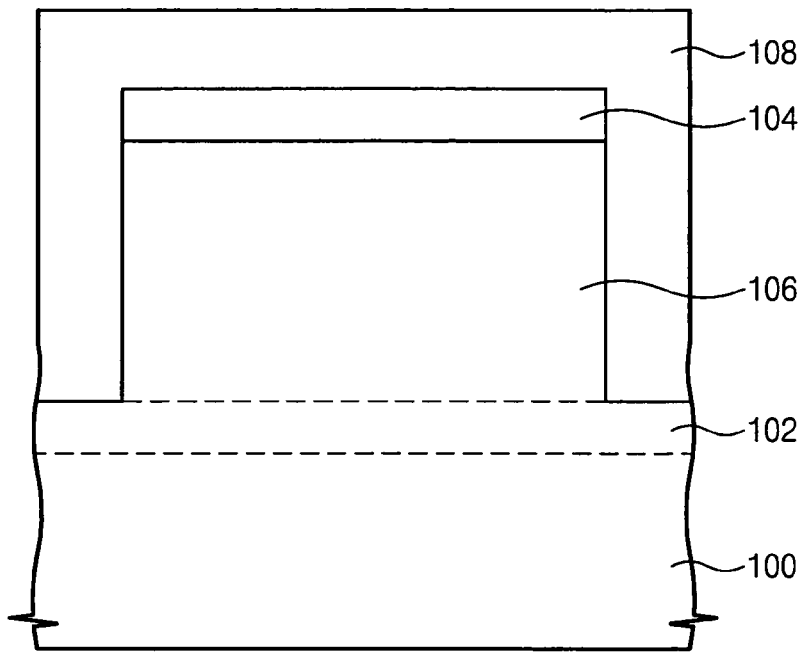
Figure 4B:
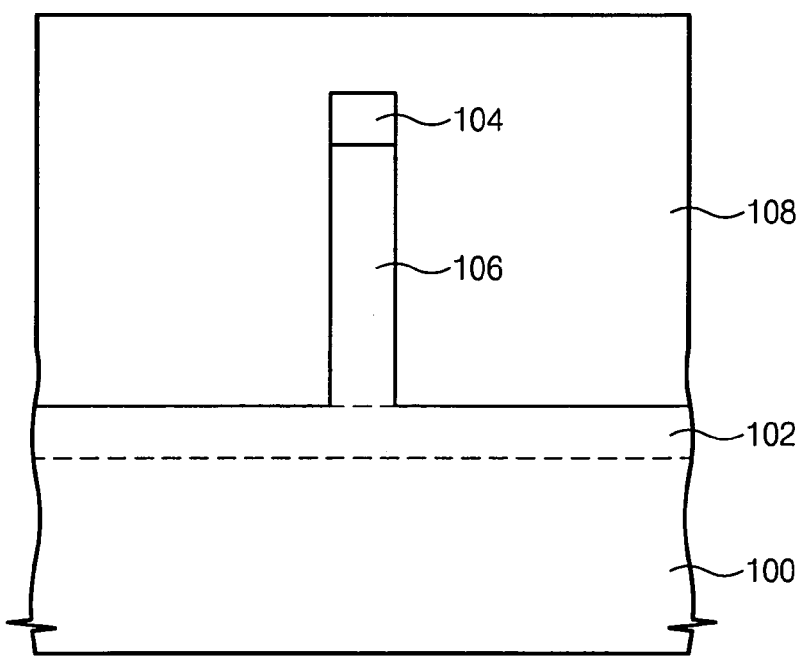
Figure 5A:
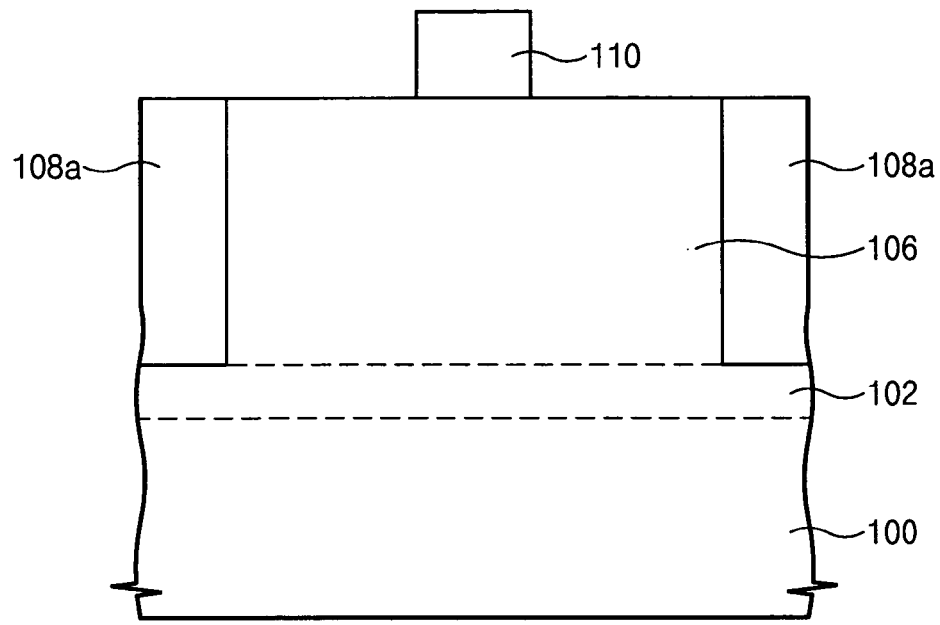
Figure 5B:
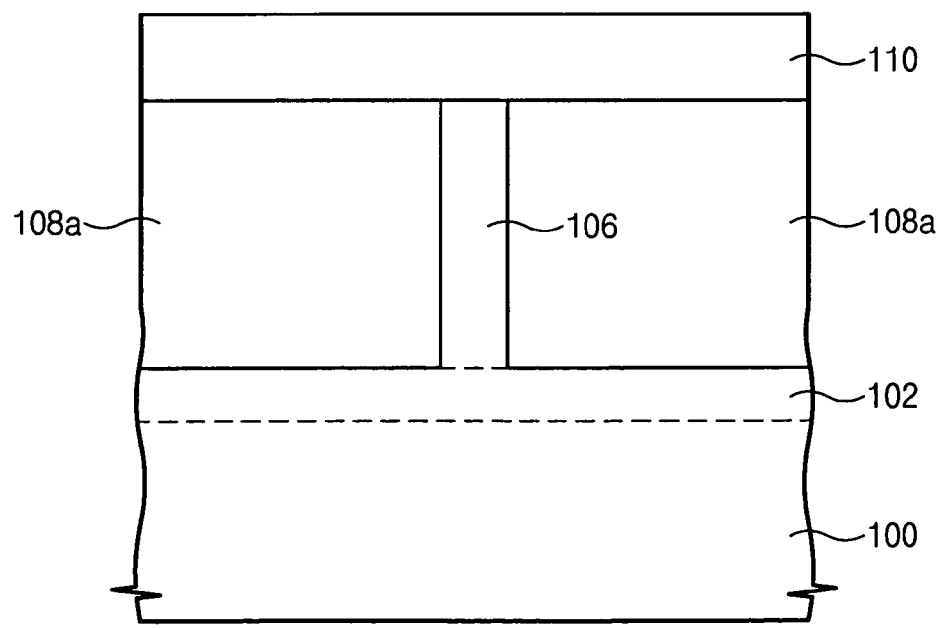
Figure 6A:
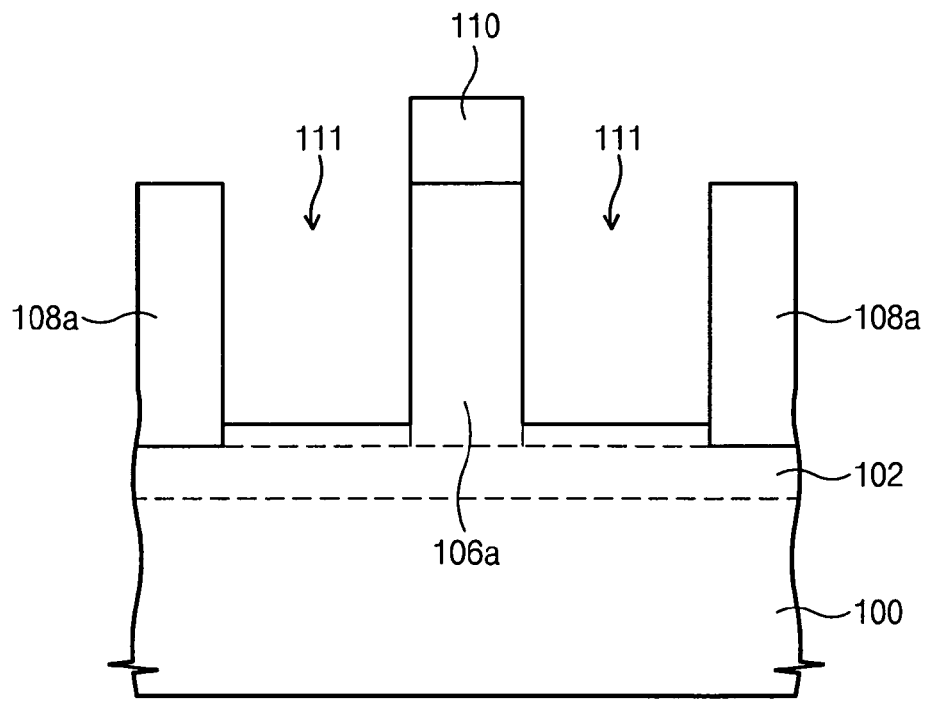
Figure 6B:
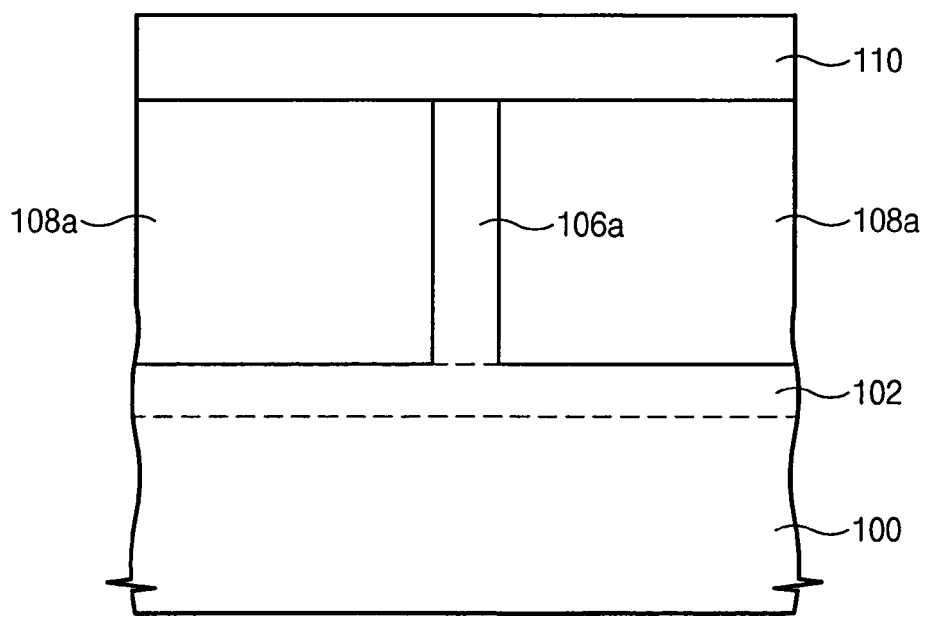
Figure 7A:
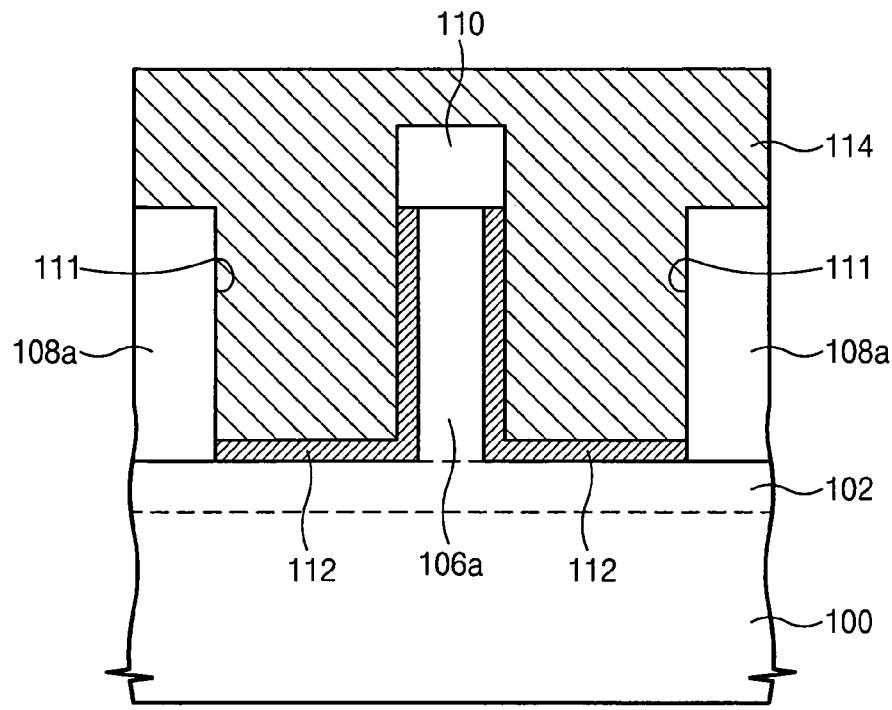
Figure 7B:
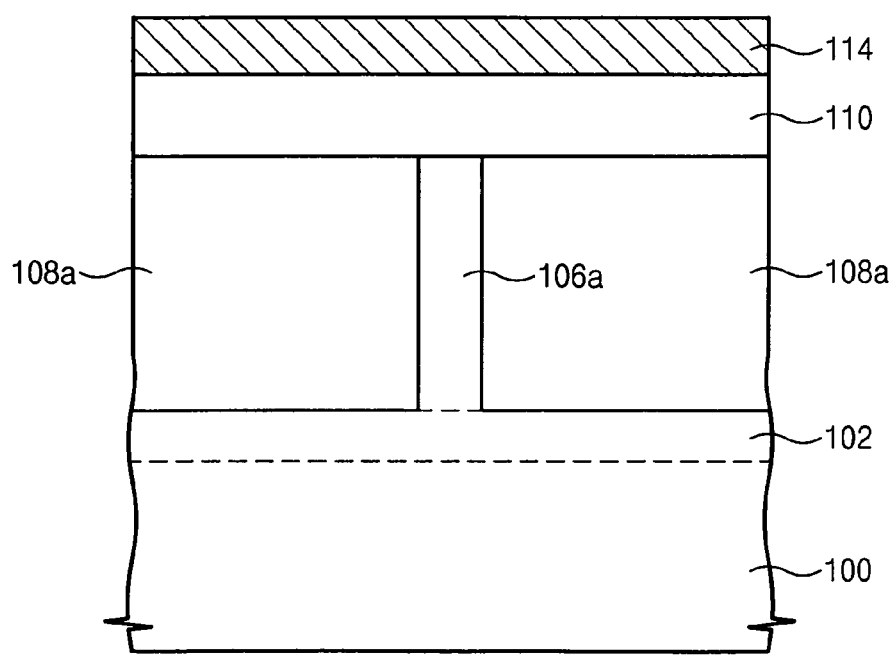
Figure 8A:
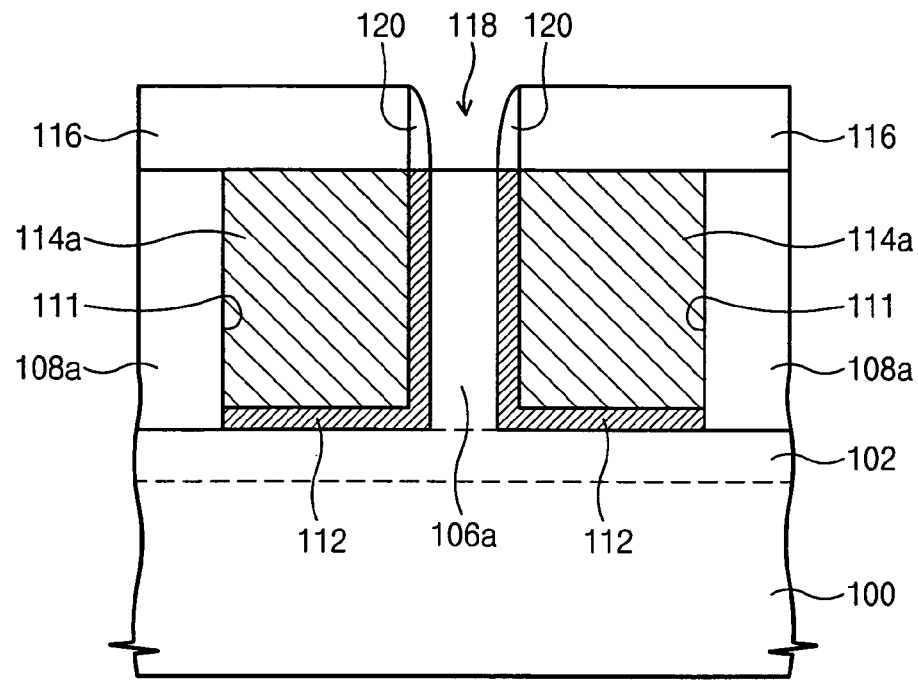
Figure 8B:
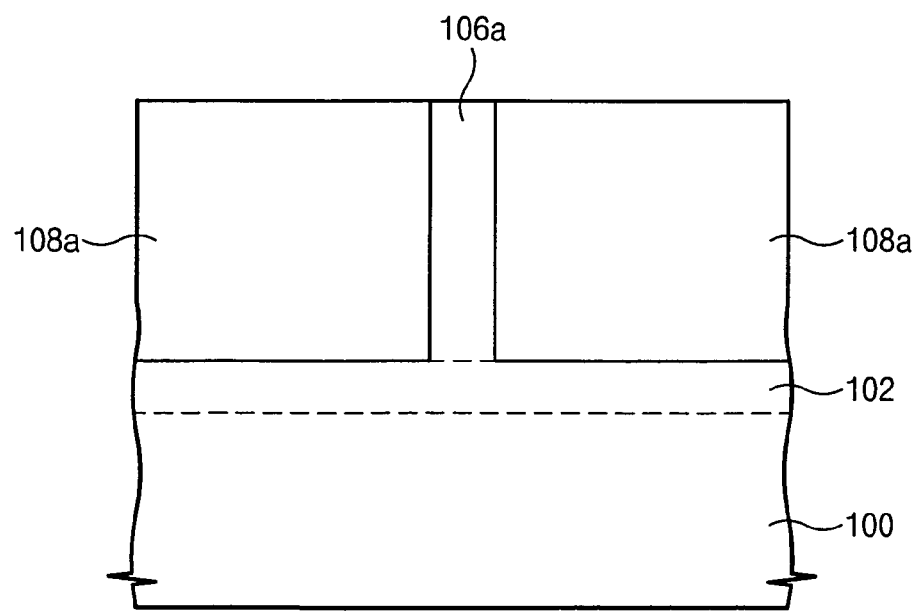

Referring to FIGS. 1, 2, and 3, a protruded channel pattern 106a is vertically extended from a substrate 100. The protruded channel pattern 106a has a pair of first sidewalls facing each other and a pair of second sidewalls facing each other. The first sidewalls may be perpendicular to the second sidewalls. A pair of in-situ doped epitaxial patterns 112 are formed on the first sidewalls of the protruded channel pattern 106a. The in-situ doped epitaxial pattern 112 covers the first sidewalls. The in-situ doped epitaxial pattern 112 is vertically protruded from the substrate 100 and is included in source/drain regions of a transistor. It is preferable that the substrate 100 be a silicon substrate. It is preferable that the protruded channel pattern 106a is formed with a single crystalline silicon. The protruded channel pattern 112 may be a part of the substrate 100. The in-situ doped epitaxial pattern 112 is a doped semiconductor layer by performing, for example, an in-situ doped SEG process. Accordingly, the in-situ doped epitaxial pattern 112 has a conformal impurity concentration throughout. That is, a first sidewall of the protruded channel pattern 106a being a channel region is connected to source/drain regions having a conformal impurity concentration throughout. It is preferable that the in-situ doped epitaxial pattern 112 be a doped single crystalline silicon.

A channel stop layer 102 may be placed in the substrate 100 under the protruded channel pattern 106a. The channel stop layer 102 may improve a punch-through characteristic between the in-situ doped epitaxial patterns 112. In addition, the channel stop layer 102 may prevent a channel from being formed at the substrate 100 under the protruded channel pattern 106a. The channel stop layer 102 is doped with impurities having a different type from the in-situ doped epitaxial pattern 112. In other words, it is preferable that the channel stop layer 102 be doped with impurities the same as doped impurities in the protruded channel pattern 106a. At this time, it is preferable that the channel stop layer 102 have a higher impurity concentration than that of the protruded channel pattern 106a.

A pair of conductive patterns 114a are formed on the sidewalls of the in-situ doped epitaxial patterns 112, respectively, opposite the protruded channel pattern 106a. The conductive pattern 114a is formed of a conductive material. For example, the conductive pattern 114a may be formed of a doped polysilicon or a conductive metal-contained material of low resistance. The material may be a material such as a conductive metal nitride (e.g., nitride titanium), a metal silicide (tungsten silicide), or a tungsten. If the conductive pattern 114a is formed of a doped polysilicon, it is preferable that the conductive pattern 114a be doped with impurities the same type as the in-situ doped epitaxial pattern 112, and has a higher impurity concentration than that of the in-situ doped epitaxial pattern. Accordingly, the conductive pattern 114a and the in-situ doped epitaxial pattern 112 may be embodied in the source/drain region with an LDD structure.

A lower portion of the in-situ doped epitaxial pattern 112 is extended along a surface of the substrate 100 to be interposed between the conductive pattern 114a and the substrate 100. The protruded channel pattern 106a, the pair of in-situ doped epitaxial patterns 112, and the pair of conductive patterns 114a are connected with each other to be like a fin-shape vertically extended from the substrate 100.

A device isolation layer 108a surrounding sidewalls of the patterns 106a, 112, and 114a is placed on the substrate 100. The device isolation layer 108a may have a top surface with substantially the same height as that of the protruded channel pattern 106a. A mold layer 116 covers the device isolation layer 108a and the patterns 106a, 112, and 114a. It is preferable that the mold layer 116 be formed of an insulating layer having an etch selectivity with respect to the device isolation layer 108a. For instance, the device isolation layer 108a is formed of silicon oxide, and the mold layer 116 may be formed of silicon nitride or silicon oxynitride.

A first groove 118 crossing the protruded channel pattern 106a is formed in the mold layer 116. The first groove 118 exposes a portion of the device isolation layer 108a and a top surface of the protruded channel pattern 106a. It is preferable that a pair of insulating spacers 120 be placed on inner walls of the first groove 118. On occasion, the first groove 118 may expose the in-situ doped epitaxial patterns 112. At this time, the insulating spacer 120 covers the exposed in-situ doped epitaxial patterns 112. It is preferable that the insulating spacer 120 be formed of an insulating layer having an etch selectivity with respect to the device isolation layer 108a. The insulating spacer 120 may be formed of the same material as the mold layer 116. For instance, the insulating spacer 120 may be formed of silicon nitride or silicon oxynitride.

Figure 9A:
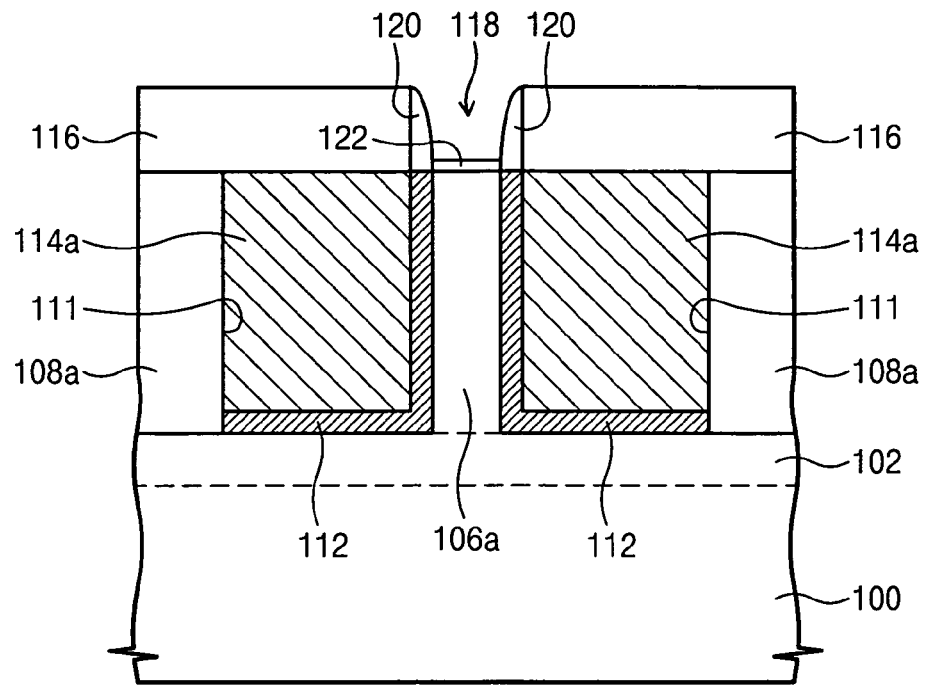
Figure 9B:
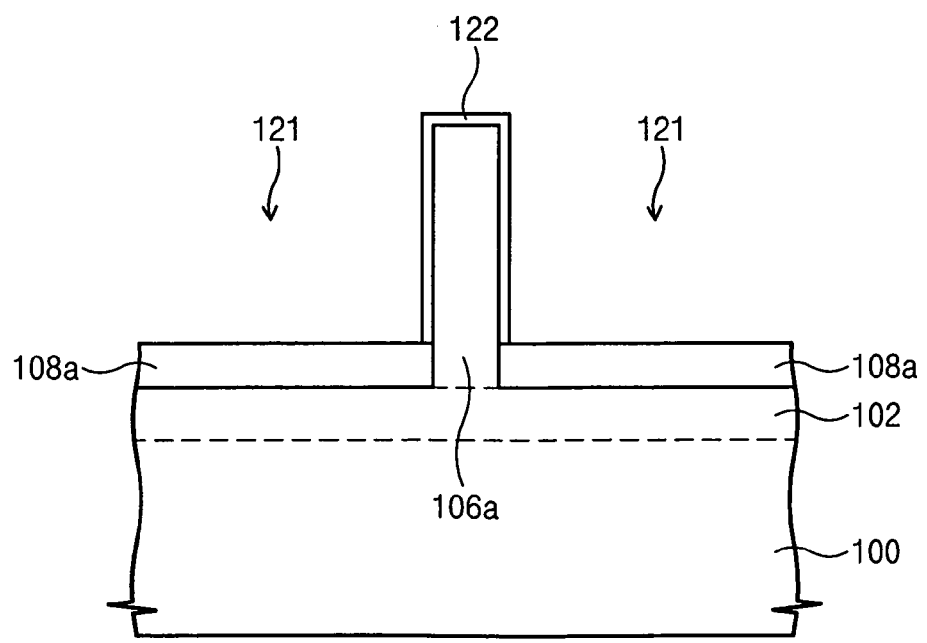

A second groove 121 (FIG. 9B) aligned with the first groove 118 is placed in the device isolation layer 108a. The second groove 121 is aligned with the insulating spacer 120. The second groove 121 exposes an upper portion of the second sidewalls. That is, lower sidewalls of the protruded channel pattern 106a are surrounded by the device isolation layer 108a. It is preferable that a bottom surface of the second groove 121 located at both sides of the protruded channel pattern 106a be formed of the device isolation layer 108a. The first and second grooves 118 and 121 comprise a gate groove.

A gate electrode 124a is filled in the gate groove, and a gate insulating layer 122 is interposed between the protruded channel pattern 106a and the gate electrode 124a. That is, the gate electrode 124a crosses the protruded channel pattern 106a and covers a top surface of the protruded channel pattern 106a and the second sidewalls. Accordingly, a channel region of a transistor includes the top surface of the protruded channel pattern under the gate electrode 124a and second sidewalls. The gate electrode 124a is formed of a conductive material. For example, the gate electrode 124a may include a doped polysilicon or a conductive metal-contained material of low resistance. The conductive metal-contained material of low resistance may be a conductive metal nitride (e.g., nitride titanium), a metal silicide (e.g., tungsten silicide), or metal (e.g., tungsten). The gate insulating layer 122 may comprise, but not limited to, a silicon oxide layer, in particular, a thermal oxidation layer. The device isolation layer 108a is interposed between a portion of the gate electrode 124a located at both sides of the protruded channel pattern 106a and the substrate 100. Therefore, a transistor may be electrically isolated with a neighboring single device.

In the transistor with the above-mentioned structure, a channel region comprises second sidewalls and a top surface of the protruded channel pattern 106a exposed at the gate groove. An in-situ doped epitaxial pattern 112 connected to the channel region of source/drain regions has a conformal impurity concentration throughout. Accordingly, the source/drain regions are connected to substantially the entire channel width of the channel region in a conformal impurity concentration. As a result, a channel is formed with respect to all channel widths of the channel region so that a driving current amount of the transistor can be maximized. That is, the driving current amount of the transistor is improved as compared with the prior art device. In addition, due to the in-situ epitaxial pattern 112, all channel lengths of the channel region are conformal. As a result, an on-off characteristic of the transistor can be stabilized.

FIGS. 4A to 9A are cross-sectional views taken along line I-I' of FIG. 1 for illustrating a method of fabricating the semiconductor device according to one embodiment of the present invention. FIGS. 4B to 9B are cross-sectional views taken along line II-II' of FIG. 1 for illustrating a method of fabricating the semiconductor device according to one embodiment of the present invention.

Referring to FIGS. 4A, 4B, 5A and 5B, impurity ions are implanted into a substrate 100 to form a channel stop layer 102 having a predetermined depth from a top surface of the substrate 100.

A hard mask pattern 104 is formed on a predetermined region of the substrate 100. The substrate 100 is etched using the hard mask pattern 104 as a mask to form an active region 106 protruded from the substrate 100. The active region 106 is a part of the substrate 100 and may be formed in a fin-shape. The hard mask pattern 104 is formed of a material having an etch selectivity with respect to the substrate 100. For instance, the hard mask pattern 104 may include a silicon nitride layer.

A device isolation insulating layer 108 is formed on the substrate 100 having the active region 106. The device isolation layer 108 sufficiently fills in an etched region of the substrate 100. The device isolation layer insulating layer 108 may be formed of silicon oxide.

The device isolation insulating layer 108 and the hard mask pattern 104 are planarized until a top surface of the active region 106 is exposed. As a result, the device isolation layer 108a is formed. At this time, the hard mask pattern 104 is removed. The device isolation layer 108a is formed such a laying siege to sidewalls of the active region 106.

A dummy gate pattern 110 extending across the exposed active region 106 is formed. The dummy gate pattern 110 may be formed in a minimal line width that can be defined by a photolithography process. The dummy gate pattern 110 is formed of a material having an etch selectivity with respect to the active region 106. For example, the dummy gate pattern 110 may comprise a silicon oxide layer.

Referring to FIGS. 6A, 6B, 7A and 7B, the active region 106 is etched, using the dummy gate pattern 110 and the device isolation layer 108a as a mask to form a protruded channel pattern 106a under the dummy gate pattern 110. At this time, a gap region 111 is formed at both sides of the dummy gate pattern 110. The gap region 111 is surrounded by the device isolation layer 108a and the protruded channel pattern 106a. The gap region 111 is a region where the active region 106 is etched. A portion of the active region 106 may remain on a bottom surface of the gap region 111. The protruded channel pattern 106a has a pair of first sidewalls and a pair of second sidewalls. The pair of first sidewalls are exposed at the gap region 111. The pair of second sidewalls are substantially perpendicular to the first sidewalls and in contact with the device isolation layer 108a.

It is preferable that a trimming process using an isotropic etch process be performed with respect to the protruded channel pattern 106a. By performing the trimming process, the width of the protruded channel pattern 106a is reduced, and sidewalls of the protruded channel pattern may be planarized smoothly. At this time, a part of the active region 106 being a bottom surface of the gap region 111 may be etched. If the dummy gate pattern 110 is formed in the minimal line width that can be defined by a photolithography process, the width of the protruded channel pattern 106a may be narrower than the minimal line width that can be defined by the photolithography process due to the trimming process. As occasion demands, the trimming process may be omitted.

An in-situ doped epitaxial pattern 112 is formed on the substrate 100 having the protruded channel pattern 106a by performing an in-situ doped epitaxial growth process. The in-situ doped epitaxial pattern 112 is included in source/drain regions. A pair of in-situ doped epitaxial patterns 112 are formed on first sidewalls of the protruded channel pattern 106a, respectively. At this time, a portion of the in-situ doped epitaxial pattern 112 is formed at a bottom surface of the gap region 111. The substrate 100 is preferably a silicon substrate, and thereby forming the in-situ doped epitaxial pattern 112 with a doped single crystalline silicon. Impurities in the in-situ doped epitaxial pattern 112 have different types than the channel stop layer 102.

By performing an in-situ doped process, an impurity concentration of the in-situ doped epitaxial pattern 112 is conformal throughout the protruded channel pattern 106a and a connection surface. As a result, in contrast with the prior art described in the background, a channel is formed at all regions of the connection surface, and channel lengths become conformal. Consequently, a driving current of a transistor is maximized, and a turn-off characteristic of the transistor is stabilized.

A conductive layer 114 filling in the gap region 114 is formed on the substrate 100 having the in-situ doped epitaxial pattern 112. The conductive layer 114 may be formed of a doped polysilicon or a conductive metal-contained material of low resistance. If the conductive layer 114 is formed of the doped polysilicon, it is preferable that impurities are doped with deposition of polysilicon and with an in-situ process.

The doped polysilicon of the conductive layer 114 may be formed by depositing an un-doped polysilicon and then implanting impurities into the un-doped polysilicon. In this case, during a thermal process for activating impurities in the conductive layer 114, impurities in the conductive layer 114 can be diffused minimally due to the in-situ doped epitaxial patterns 112. Additionally, impurities in the in-situ doped epitaxial patterns 112 are already activated. Accordingly, during the thermal process for activating impurities in the conductive layer 114, implanting impurities in the in-situ doped epitaxial pattern 112 into the protruded channel pattern 106a is minimized. As a result, if a doped polysilicon of the conductive layer 114 is doped by implanting impurities, an impurity concentration in the conductive layer 114 may be conformal by sufficiently performing a thermal process for activation. Even if the impurity concentration in the conductive layer 114 is not conformal, source/drain regions are connected in a conformal impurity concentration throughout a channel region because the in-situ doped epitaxial pattern 112 with the conformal impurity concentration is connected to the protruded channel pattern 106a.

Referring to FIGS., 8A, 8B, 9A, and 9B, a conductive pattern 114a is formed in the gap region 111 by etching the conductive layer 114 until the device isolation layer 108a is exposed. The conductive layer 114 is etched by only an etch-back process to form the conductive pattern 114a. After chemical mechanical polishing the conductive layer 114 until the dummy gate pattern 110 is exposed, the conductive pattern 114a may be formed by performing the etch-back process with respect to the polished conductive layer 114 until the device isolation layer 108a is exposed.

Next, a mold layer 116 is formed on the resulting structure 100, and then the mold layer 116 is planarized until the dummy gate pattern 110 is exposed. The mold layer 116 is formed with an insulating layer having an etch selectivity with respect to the device isolation layer 108a and the dummy gate pattern 110. For example, the mold layer 116 may comprise silicon nitride or silicon oxynitride.

The dummy gate pattern 110 is removed using the planarized mold layer 116 as an etch mask to form a first groove 118. At this time, the protruded channel pattern 106a may be used as an etch stop layer. For this reason, the first groove 118 can expose a top surface of the device isolation layer 108a and the protruded channel pattern 106a.

If the trimming process is performed, the in-situ doped epitaxial pattern 112 may be exposed at the first groove 118. Accordingly, it is preferable that an insulating spacer 120 covering the exposed in-situ doped epitaxial pattern 112 be formed on inner walls of the first groove 118. The insulating spacer 120 may be an insulating layer having an etch selectivity with respect to the device isolation layer 108a. For instance, the insulating spacer 120 may comprise silicon nitride or silicon oxynitride as the mold layer 116.

Impurity ions for controlling a threshold voltage in the protruded channel pattern 106a may be implanted using the mold layer 116 and the insulating spacer 120 as a mask.

The device isolation layer 108a is etched using the mold layer 116 and the insulating spacer 120 as a mask to form a second groove 121 in the device isolation layer 108a. The second groove 121 exposes second sidewalls of the protruded channel pattern 106a. Preferably, the second groove 121 exposes an upper portion of the second sidewalls. The first and second grooves 118 and 121 comprise a gate groove.

A gate insulating layer 122 is formed on the substrate 100 having the gate groove. The gate insulating layer 122 may be a silicon oxide layer, specifically, a thermal oxide layer. A gate conductive layer filled in the gate groove is formed on the substrate 100 having the gate insulating layer 122. A gate electrode 124a shown in FIGS. 1 to 3 is formed by planarizing the gate conductive layer until the mold layer is exposed.

In the above-mentioned method, the gate electrode 124a may be formed having a narrower width than the minimal line width that can be defined by the photography process due to the trimming process and the insulating spacer 120. Accordingly, the semiconductor device is suitable for achieving high-integration of semiconductor devices.

In another embodiment of the present invention, a transistor for securing more driving current is disclosed. The transistor includes a channel pattern vertically protruded and an in-situ doped epitaxial pattern.

Figure 10:
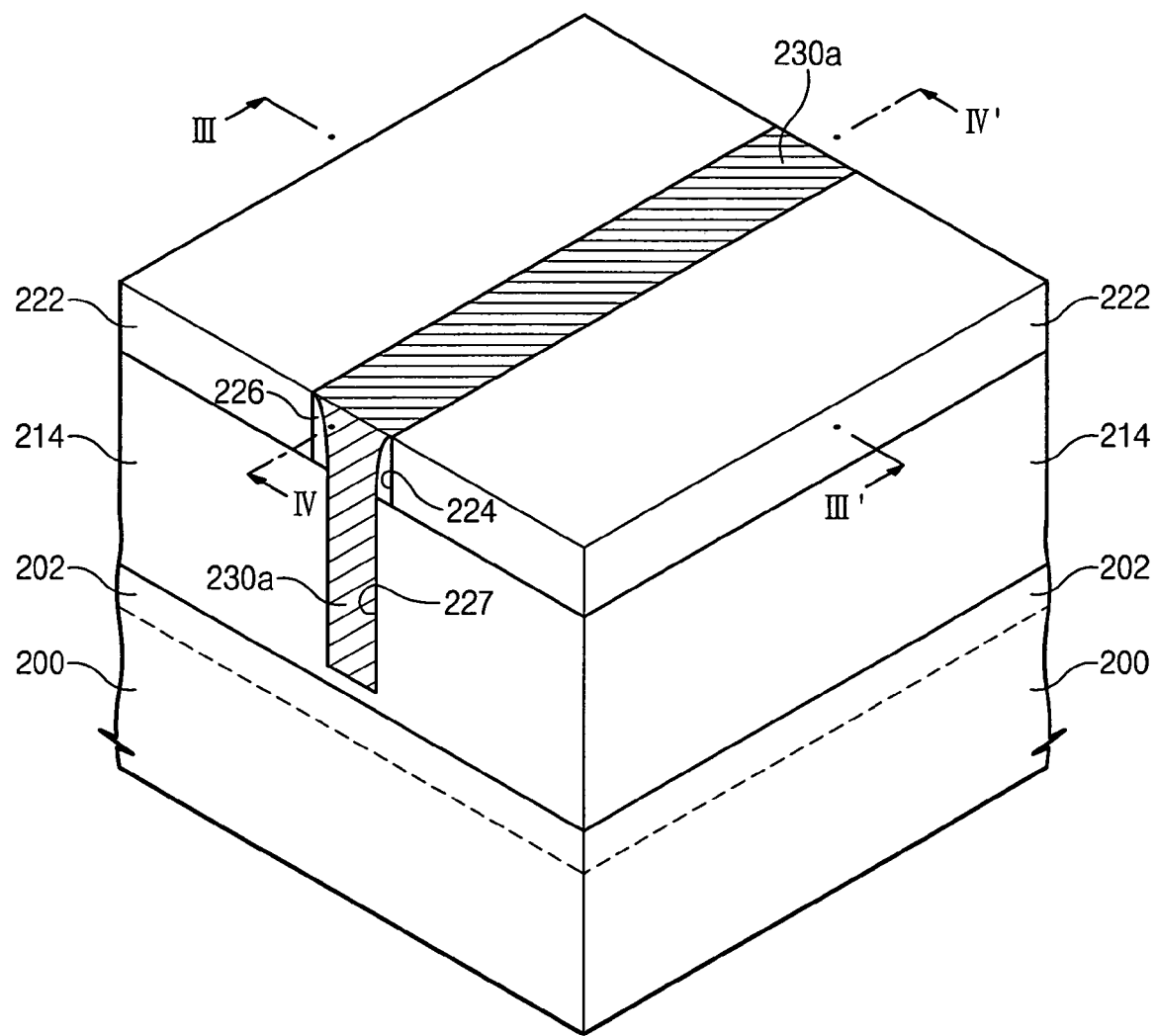
FIG. 10 is a perspective view showing the semiconductor device according to one embodiment of the present invention.
Figure 11:
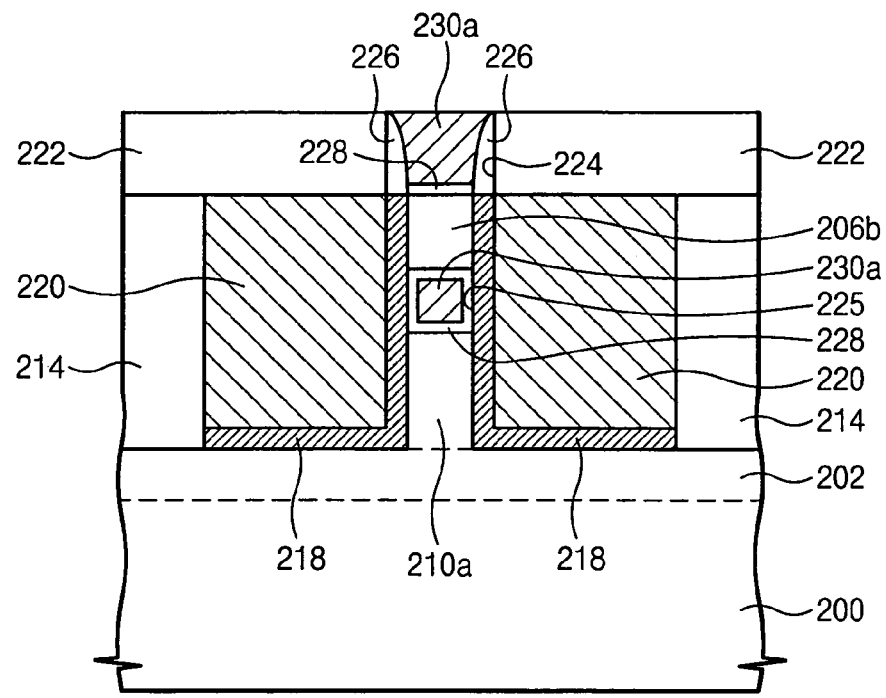
FIGS. 11 and 12 are cross-sectional views taken along line III-III' and IV-IV' of FIG. 10, respectively.
Figure 12:
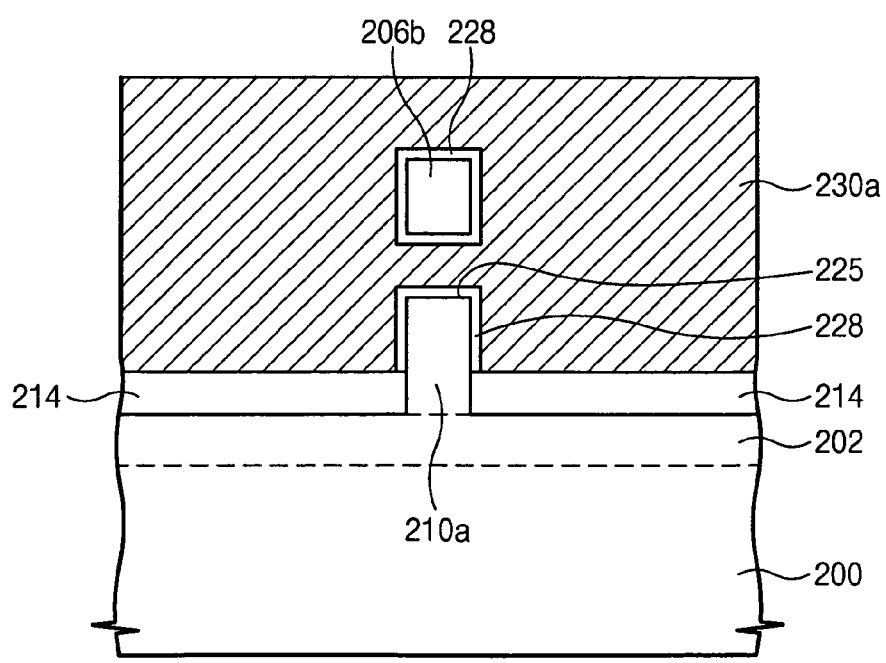

FIG. 10 is a perspective view showing the semiconductor device according to another embodiment of the present invention. FIGS. 11 and 12 are cross-sectional views taken along line III-III' and IV-IV' of FIG. 10, respectively.

Referring to FIGS., 10, 11 and 12, a protruded channel pattern 210a is vertically extended from a substrate 200. The protruded channel pattern 210a includes a pair of first sidewalls and a pair of second sidewalls, each sidewall of each pair facing each other, respectively. The first and second sidewalls are substantially perpendicular to each other. A separated channel pattern 206b is placed on an upper portion of the protruded channel pattern 210a. The separated channel pattern 206b is vertically isolated from a top surface of the protruded channel pattern 210a. The separated channel pattern 206b has sidewalls aligned with the protruded channel pattern 210a. That is, the separated channel pattern 206b has third sidewalls and fourth sidewalls. The third sidewalls are aligned with the first sidewalls, and the fourth sidewalls are aligned with the second sidewalls. It is preferable that the substrate 200 be a silicon substrate, and the protruded channel pattern 210a is a single crystalline silicon. The separated channel pattern 206b may be a single crystalline semiconductor layer having the same elements as the protruded channel pattern 210a. In particular, it is preferable that the separated channel pattern 206b is a strained crystalline silicon having a lattice width wider than the protruded channel pattern 210a.

A pair of in-situ doped epitaxial patterns 218 are formed on the first sidewalls of the protruded channel pattern 210a, respectively. At this time, the in-situ doped epitaxial patterns 218 are vertically extended to be connected to the third sidewalls of the separated channel pattern 206b. The in-situ doped epitaxial pattern 218 is included in source/drain regions of a transistor. The separated channel pattern 206b is supported by the in-situ doped epitaxial pattern 218 to be vertically isolated from the protruded channel pattern 210a. A tunnel 225 is placed, surrounded by the pair of in-situ epitaxial patterns 218, a bottom surface of the separated channel pattern 206b, and a top surface of the protruded channel pattern 210a.

The in-situ doped epitaxial pattern 218 is a semiconductor layer formed by an in-situ doped epitaxial growth process. For example, it is preferable that the in-situ doped epitaxial pattern 218 is a doped single crystalline silicon. The in-situ doped epitaxial pattern 218 has a conformal impurity concentration throughout.

A channel stop layer 202 may be placed in the substrate 200 under the protruded channel pattern 210a. It is preferable that the channel stop layer 202 has the same impurity type as an impurity in the protruded channel pattern 210a and at the same time, has a higher concentration than the protruded channel pattern 210a. The channel stop layer 202 improves a punch-through characteristic between the source/drain regions and suppresses forming a channel under the protruded channel pattern 210a.

A pair of conductive patterns 220 are formed at one sidewall of the in-situ doped epitaxial patterns 218 opposite the protruded channel pattern 210a, respectively. The conductive pattern 220 may include a doped polysilicon or a conductive metal-contained material of low resistance. The conductive metal-contained material of low resistance may be the same material as in the embodiment shown in FIGS. 1-3. The conductive pattern 220 is included in source/drain regions. A lower sidewall of the in-situ doped epitaxial pattern 218 is extended along a surface of the substrate 200 to be interposed between the substrate 200 and the conductive pattern 220.

A construction constituted with the protruded channel pattern 210a, the separated channel pattern 206b, the in-situ doped epitaxial patterns 218, and the conductive patterns 200 is like a fin shape that is protruded from the substrate 200. A top surface of the construction may be wider than that of a conventional fin-type transistor.

A device isolation layer 214 covering exposed sidewalls of the patterns 210a, 206b, 218, and 220 is placed on the substrate 200. At this time, a top surface of the separated channel pattern 206b, the in-situ doped epitaxial patterns 218, and the conductive patterns 220 is exposed. A mold layer 222 covering the device isolation layer 214 and the exposed patterns 210, 206b, 218, and 220 is placed. The mold layer 222 is formed with an insulating layer having an etch selectivity with respect to the device isolation layer 214. For example, the device isolation layer 214 may comprise a silicon oxide layer. The mold layer 222 may be a silicon nitride layer or a silicon oxynitride layer.

A first groove 224 crossing the separated channel pattern 206b is placed in the mold layer 222. The first groove 224 exposed the device isolation layer 214 and the separated channel pattern 206b. It is preferable that an insulating spacer 226 be formed on inner walls of the first groove 224. Depending on the circumstances, the first groove 224 may expose the in-situ doped epitaxial pattern 218. At this time, the insulating spacer 226 covers the exposed in-situ doped epitaxial pattern 218. The insulating spacer 226 may be an insulating spacer having an etch selectivity with respect to the device isolation layer 214. For instance, the insulating spacer 226 may be formed of silicon nitride or silicon oxynitride, the same as the mold layer 222.

A second groove 227 aligned with the first groove 224 is placed in the device isolation layer 214. Preferably, the second groove 227 is aligned with the insulating spacer 226. The second groove 227 exposes the separated channel pattern 206b and the protruded channel pattern 210a. The second groove 227 exposes second sidewalls of the protruded channel pattern 210a, fourth sidewalls of the separated channel pattern 225, and the tunnel 225. Accordingly, the second groove 227 exposes inner walls of the tunnel 225, that is, a top surface of the protruded channel pattern 210a, a bottom surface of the separated channel pattern 206b, and a part of sidewalls of the in-situ doped channel patterns 218. Preferably, the second groove 227 exposes an upper portion of the second sidewalls. The first and second grooves 224 and 227 comprise a gate groove.

A gate electrode 230a is filled in the gate groove. That is, the gate electrode 230a extends across the protruded channel pattern 210a and the separated channel pattern 206b. A gate insulating layer 228 is interposed between the gate electrode 230a and the protruded channel pattern 210a, and between the gate electrode 230a and the separated channel pattern 206b. In addition, the gate electrode is filled in the tunnel 225. The gate insulating layer 228 is interposed between the gate electrode 230a and the in-situ doped epitaxial patterns 218. In other words, the gate electrode 230a covers second sidewalls and a top surface of the protruded channel pattern 210a, and third sidewalls, a top surface, and a bottom surface of the separated channel pattern 206b.

The gate electrode 230a is formed of a conductive material. For example, the gate electrode 230a may include a doped polysilicon or a conductive metal-contained material of low resistance. The conductive metal-contained material of low resistance may be the same material as in the above-mentioned embodiment. Since the device isolation layer 214 or the channel stop layer 202 is placed under the gate electrode 230a that is located at both sides of the protruded channel pattern 210a, the transistor may be electrically isolated with neighboring other devices (not shown).

In the transistor with the above-mentioned structure, a channel region of the transistor includes second sidewalls and a top surface of the protruded channel pattern 210a exposed at the gate groove 224 and top and bottom surfaces and fourth sidewalls of the separated channel pattern 206b. For this reason, a channel length of the transistor is increased. In addition, the in-situ doped epitaxial pattern 218 is connected to substantially the entire channel width of the channel region in a conformal concentration, and channel widths of the channel regions are conformal. As a result, now that the transistor uses all wider channel widths, a driving current of the transistor becomes increased. In addition, an on-off characteristic of the transistor is stabilized.

Moreover, the separated channel pattern 206b is formed of a strained crystalline silicon. Accordingly, the mobility and amount of carriers in the channel regions is increased so that a driving current of the transistor may be increased further.

For the transistor shown in FIGS. 11 and 12, the gate electrode 230a is filled in the tunnel 225. However, another material may be filled in the tunnel 225. This will be described referring to FIGS. 13 and 14.

Figure 13:
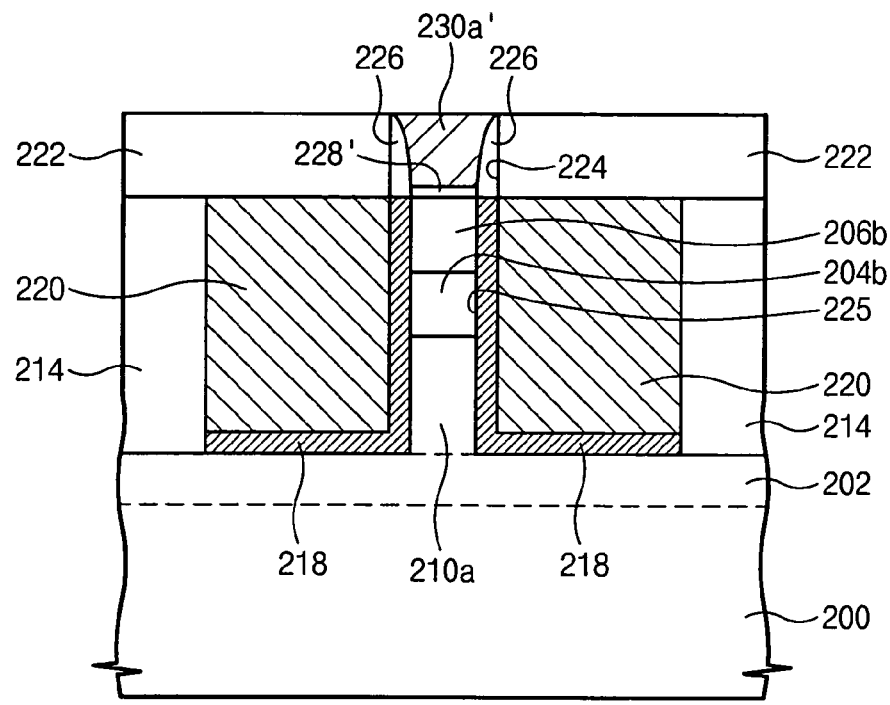
FIGS. 13 and 14 are cross-sectional views taken along line III-III' and IV-IV' of FIG. 10 for showing a modification example of the semiconductor device according to another embodiment of the present invention.
Figure 14:
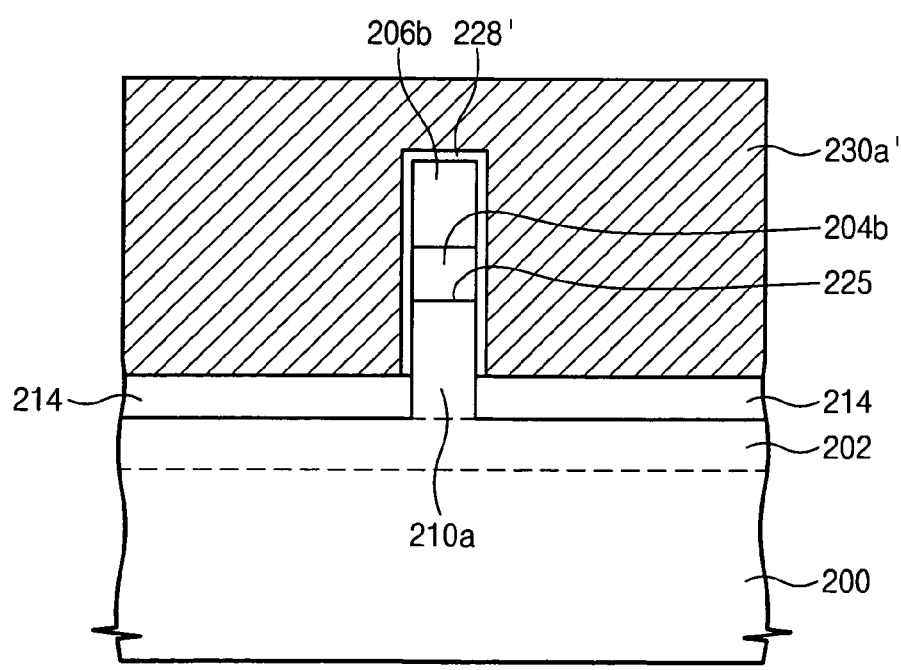
Figure 15A:
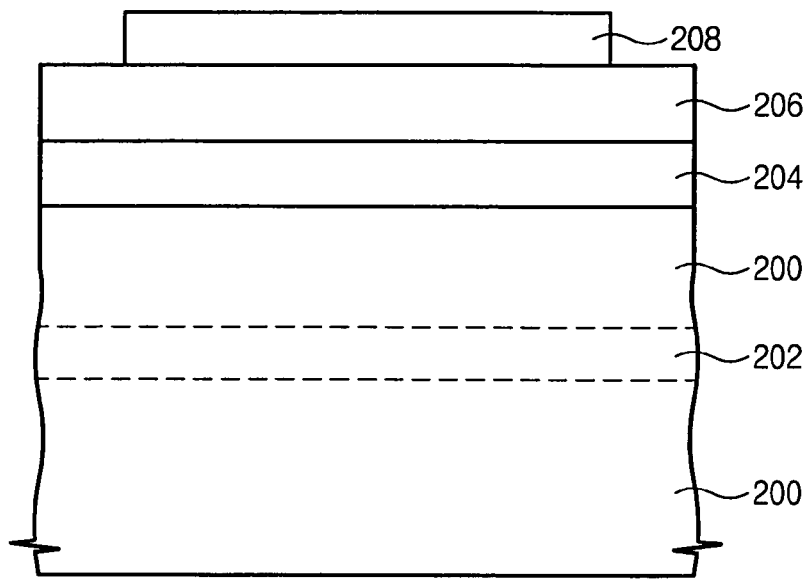
Figure 15B:
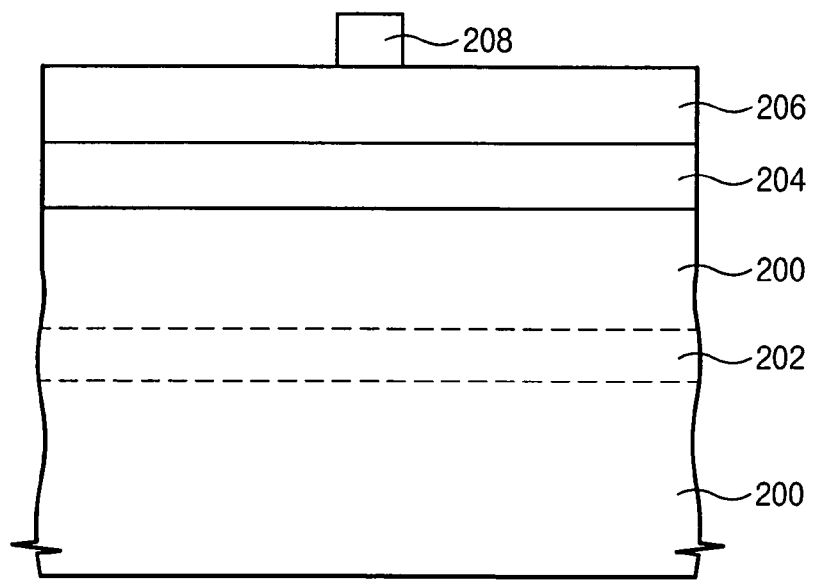
Figure 16A:
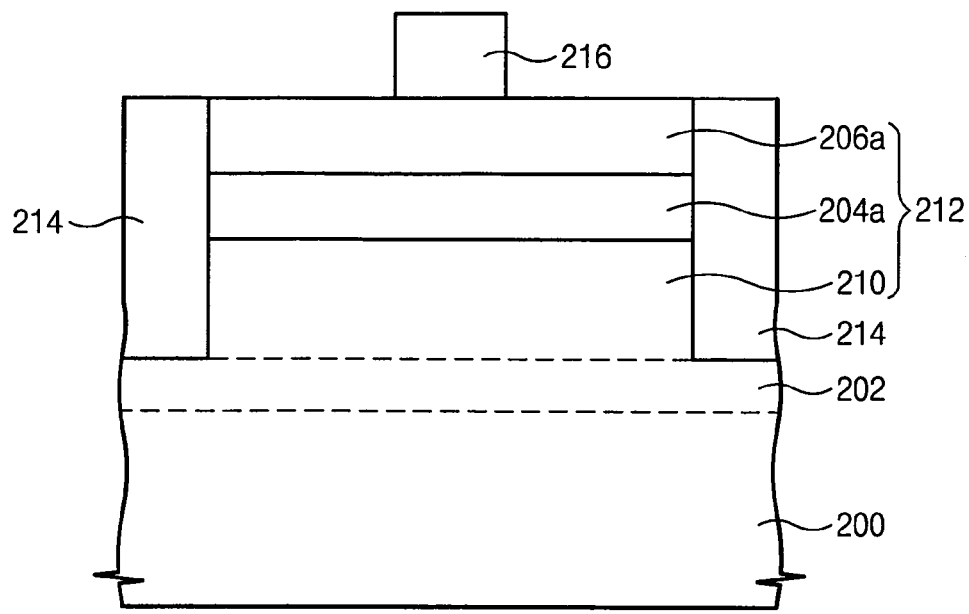
Figure 16B:
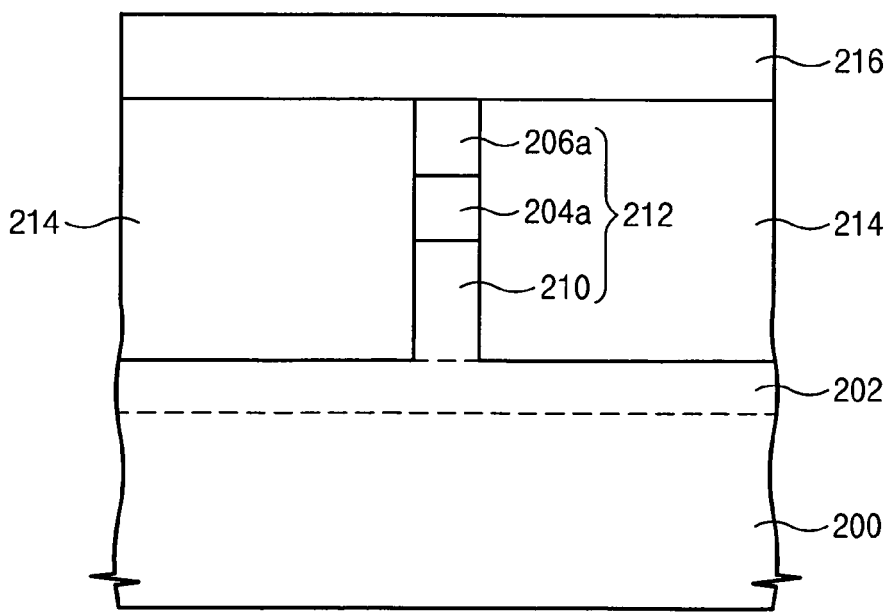
Figure 17A:
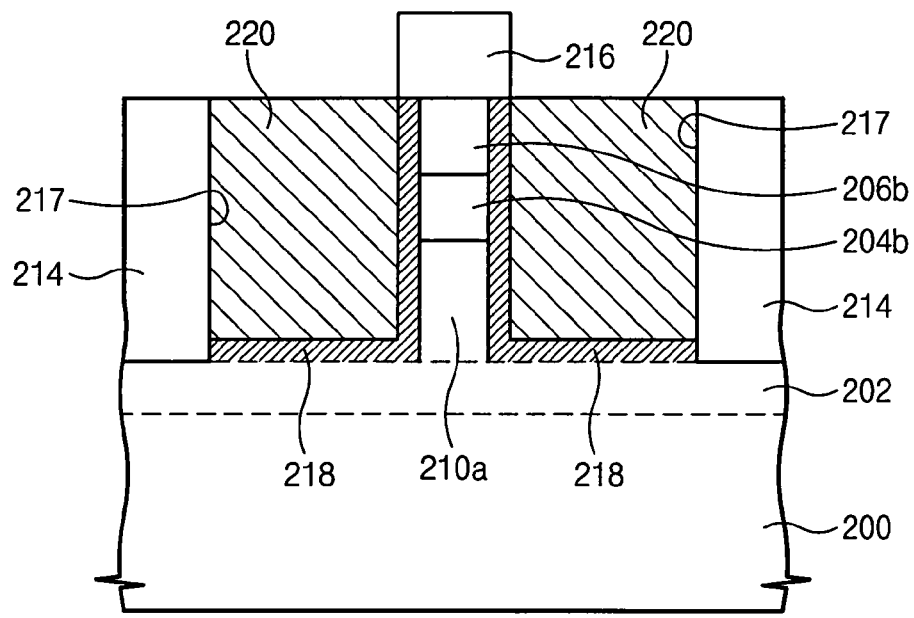
Figure 17B:
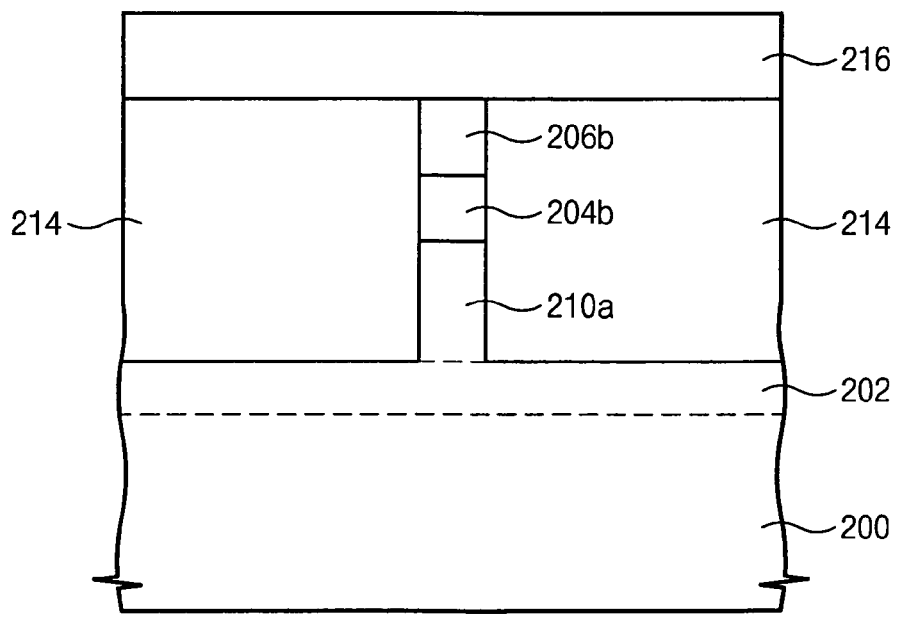
Figure 18A:
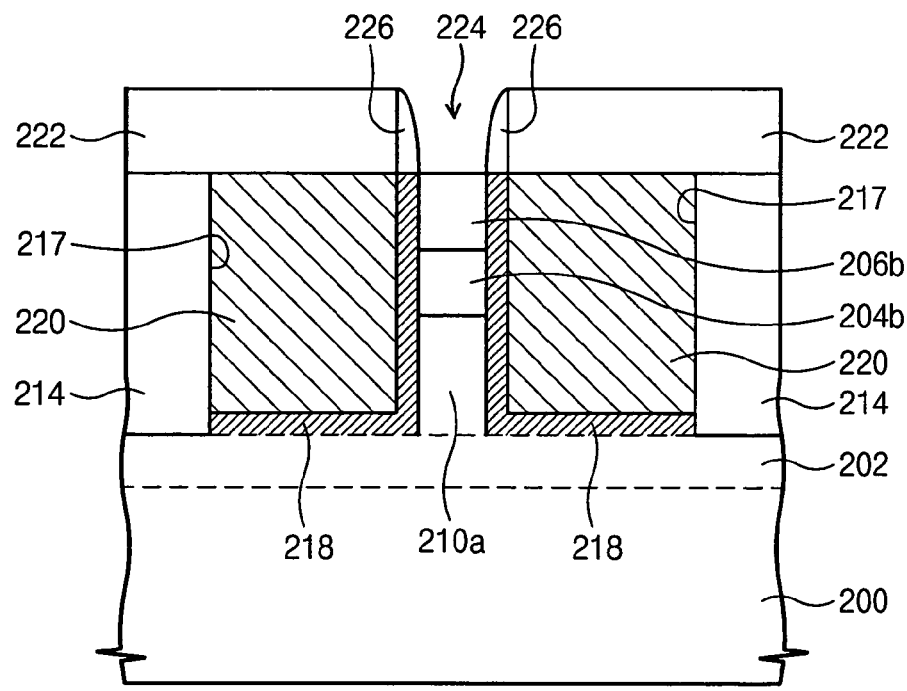
Figure 18B:
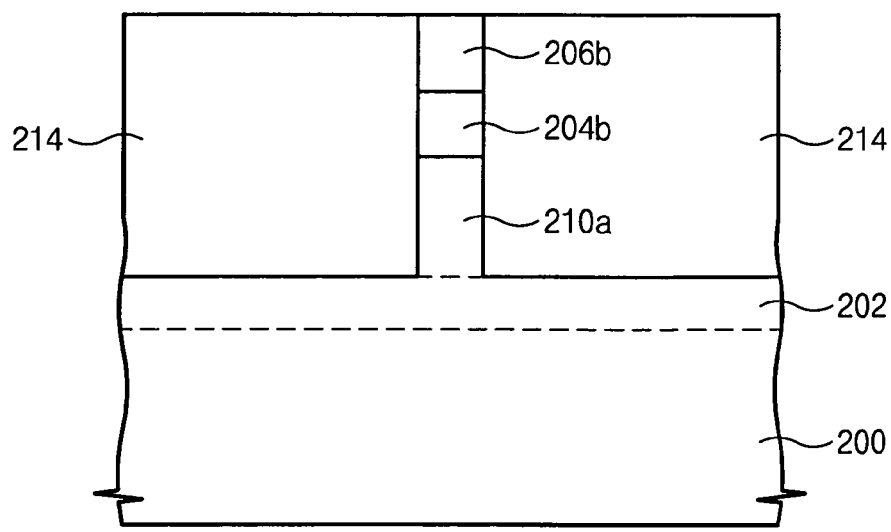
Figure 19A:
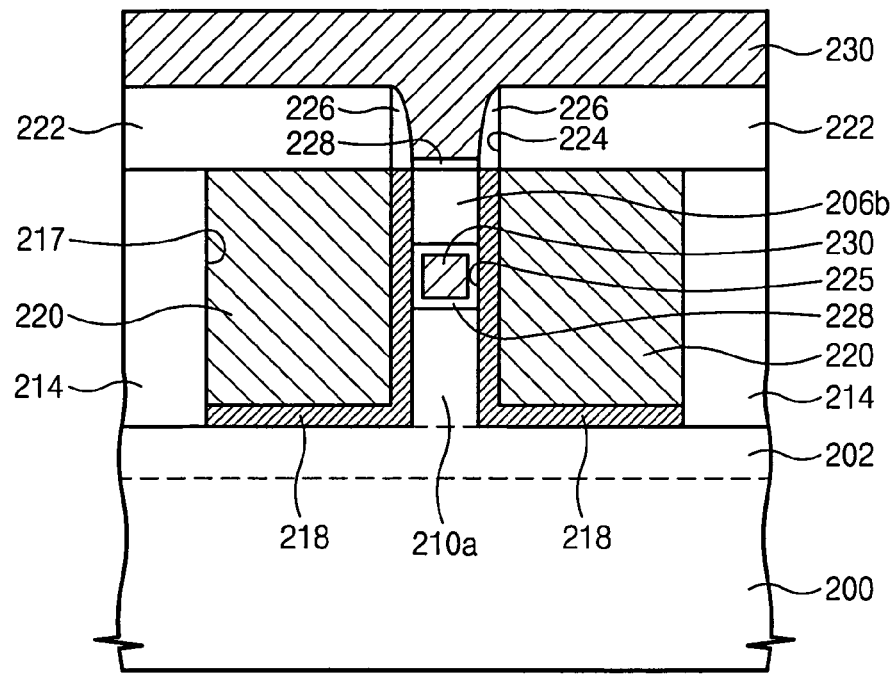
Figure 19B:
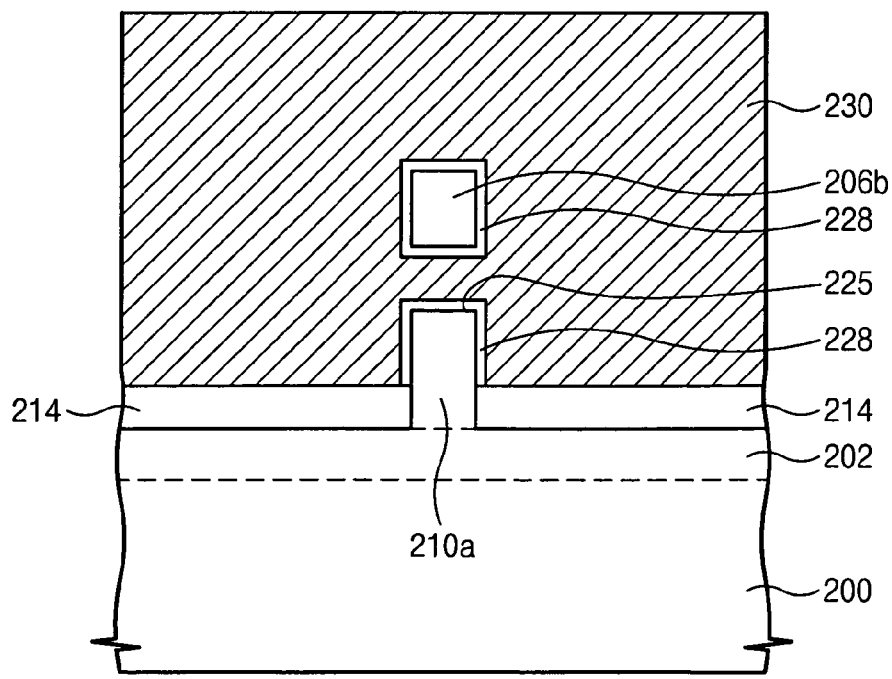

FIGS. 13 and 14 are cross-sectional views taken along line III-III' and IV-IV' of FIG. 10 to show a modified example of the semiconductor device according to still another embodiment of the present invention.

Referring to FIGS. 13 and 14, a channel interlayer pattern 204b is filled in the tunnel 225. In other words, the channel interlayer pattern 204b is in contact with inner walls of the tunnel 225, that is, a top surface of the protruded channel pattern 210a, a bottom surface of the separated channel pattern 206b, and a part of sidewalls of the in-situ doped epitaxial pattern 218. The channel interlayer pattern 204b has sidewalls aligned with sidewalls of the protruded and separated channel patterns 210a and 206b.

It is preferable that the channel interlayer pattern 204b is formed of a single crystalline semiconductor layer having a lattice width wider than the protruded channel pattern 210a. In addition, it is preferable that the channel interlayer pattern 204b is formed of a single crystalline semiconductor layer having an etch selectivity with respect to the protruded and separated channel pattern 210a and 206b. For instance, it is preferable that the channel interlayer pattern 204b is a silicon-germanium layer. Germanium atoms in the silicon-germanium layer have a radius larger than silicon atoms. Accordingly, the silicon-germanium layer has a lattice width wider than the single crystalline silicon. In particular, preferably, a germanium concentration in the channel interlayer pattern 204b is gradually increased from a bottom surface to a top surface, and thereby gradually increasing a lattice width. As a result, the channel interlayer pattern 204b may absorb the stress resulting from the difference of a lattice width between the protruded channel pattern 210a and the separated channel pattern 206b.

Due to the channel interlayer pattern 204b, a gate electrode 230a' covers second sidewalls of the protruded channel pattern 210a, fourth sidewalls of the separated channel pattern 206b, and sidewalls aligned with the second and fourth sidewalls of the channel interlayer pattern 204b. A gate insulating layer 228' is extended to be interposed between the gate electrode 230a' and the protruded channel pattern 210a, and between the gate electrode 230a' and the separated channel pattern 206b.

In the transistor according to the above-mentioned modification embodiment, the channel interlayer pattern 204b and the separated channel pattern 206b may be made of a single crystalline structure having a lattice width wider than the protruded channel pattern 210a. For this reason, the mobility and amount of the carriers in the channel region are increased. Accordingly, a driving current of the transistor is increased.

FIGS. 15A to 19A are cross-sectional views taken along line III-III' of FIG. 10 to illustrate a method of fabricating the semiconductor device according to yet another embodiment of the invention. FIGS. 15B to 19B are cross-sectional views taken along line IV-IV' of FIG. 10 to illustrate the method of fabricating the semiconductor device according to another embodiment of the present invention.

Referring to FIGS., 15A, 15B, 16A, and 16B, a channel stop layer 202 is formed at a predetermined depth from a substrate 200. The channel stop layer 202 may be formed the same as in the embodiment shown in FIGS. 1-3.

An interlayer semiconductor layer 204 and a channel semiconductor layer 206 are sequentially formed on the substrate 200. It is preferable that the interlayer semiconductor layer 204 has an etch selectivity with respect to the channel semiconductor layer 206 and the substrate 200, and is formed of a single crystalline semiconductor layer having a lattice width wider than the substrate 200. It is preferable that the channel semiconductor layer 206 is formed of single crystalline silicon having a lattice width wider with respect to the substrate 200. For example, the substrate 200 is a silicon substrate, the interlayer semiconductor layer is formed of silicon germanium, and the channel semiconductor layer may be formed of a strained crystalline silicon.

The interlayer semiconductor layer 204 is formed by performing an epitaxial growth process using silicon and germanium source gases on the substrate 200. At this time, it is preferable that the concentration of germanium source gas is gradually increased. Accordingly, the germanium concentration in the interlayer semiconductor layer 204 is gradually increased from a bottom surface to a top surface so that the lattice width of the interlayer semiconductor layer 204 is gradually increased. The channel semiconductor layer 206 is formed by performing an epitaxial growth process using only silicon source gases on the interlayer semiconductor layer 204. Therefore, the channel semiconductor layer 206 is formed of a strained crystalline silicon having a lattice width wider than the substrate 200 due to the interlayer semiconductor layer 204.

A hard mask pattern 208 is formed on a predetermined region of the channel semiconductor layer 206. The hard mask pattern 208 is formed of a material having an etch selectivity with respect to the channel semiconductor layer 206, the interlayer semiconductor layer 204, and the substrate 200. For instance, the hard mask pattern 208 may include a silicon nitride layer.

The channel semiconductor layer 206, the interlayer semiconductor layer 204, and the substrate are successively etched using the hard mask pattern 208 as a mask to form an active 212 region protruded from the substrate 200. The active region 212 comprises a protruded portion 210 of the substrate, a patterned interlayer semiconductor layer 204a, and a patterned channel semiconductor layer 206, which are sequentially stacked. It is preferable that the protruded portion 210 of the substrate is a part of the substrate located on the channel stop layer 202. The active region may be formed in a fin-shape.

A device isolation layer 214 covering the active region 212 is formed on the substrate 200. At this time, the hard mask pattern 208 is removed to expose a top surface of the active region 212. In the same material and in the same way as in the embodiment shown in FIGS. 1-3, the device isolation layer 214 may be formed.

A dummy gate pattern 216 crossing the active region 212 is formed on the device isolation layer 214. It is preferable that the dummy gate pattern 216 is formed of a material having an etch selectivity with respect to the active region 212. In other words, the dummy gate pattern 216 may be formed of a silicon oxynitride layer.

Referring to FIGS., 17A, 17B, 18A, 18B, 19A, and 19B, the active region 212 is etched using the dummy gate pattern 216 as a mask to form a protruded channel pattern 210a, the channel interlayer pattern 204b, and the isolation channel pattern 206b, which are sequentially stacked under the dummy gate pattern 216. At this time, a pair of gap regions 217, being an etched region of the active region 212, are formed at both sides of the dummy gate pattern 204b, respectively. The protruded channel pattern 210a is a part of the protruded portion 210 of the substrate. The channel interlayer pattern 204b is a part of the patterned interlayer semiconductor layer 204a. The separated channel pattern 206b is a part of the patterned channel semiconductor layer 206b. One inner sidewall of the gap region 217 is formed of the device isolation layer 214, and the other inner sidewall of the gap region 217 is formed of the patterns 210a, 204b, and 206b. A bottom surface of the gap region may be a part of the protruded portion 210 of the substrate or the substrate 200.

Preferably, a trimming process using an isotropic etch process having the same etch ratio with respect to the patterns 210a, 204b, and 206b is performed. Accordingly, a surface of sidewalls of the patterns 210a, 204b, and 206b exposed at the gap region 217 is planarized, and the width of the patterns 210a, 204b, and 206b (a channel length of a transistor) is reduced. If the dummy gate pattern 216 is formed in the minimal line width that can be defined by a lithography process, the width of the patterns 210a, 204b, and 206b may be narrower than the minimal line width that can be defined by the lithography process due to the trimming process. During the trimming process, a part of the protruded portion 210 exposed at the bottom surface of the gap region 217 may be etched.

The protruded channel pattern 210a has a pair of first sidewalls and second sidewalls. The pair of the first sidewalls are exposed at the gap region 217, and the second sidewalls are covered with the device isolation layer 218. The separated channel pattern 206b has third sidewalls and fourth sidewalls. The third sidewalls are exposed at the gap region 217 and aligned with the first sidewalls. The fourth sidewalls are aligned with the second sidewalls. The sidewalls of the channel interlayer pattern 204b have sidewalls that are aligned with the protruded and separated channel patterns 210a and 206b.

Next, an in-situ doped selectively epitaxial growth (SEG) process is performed to form a pair of in-situ doped epitaxial pattern 218 at both sidewalls of the patterns 210a, 204b, and 206b. It is preferable that the in-situ doped epitaxial pattern 218 is formed of a doped single crystalline silicon. The in-situ doped epitaxial pattern 218 may be formed at a bottom surface of the gap region 217.

A conductive pattern 220 filling in the gap region 217 is formed. In the same material and in the same way as in the embodiment shown in FIGS. 1-3, the conductive pattern 220 may be formed.

A mold layer 222 is formed on the substrate 200. The mold layer 222 is planarized until the dummy gate pattern 216 is exposed. The mold layer 222 may be formed of an insulating layer having an etch selectivity with respect to the dummy gate pattern 216 and the device isolation layer 214, that is, a silicon nitride layer or a silicon oxynitride layer.

The dummy gate pattern 216 is removed using the planarized mold layer 222 as a mask to form a first groove 224. At this time, the separated channel pattern 206b may be used as an etch stop layer. The first groove 224 crosses the separated channel pattern 206 and exposes a top surface of the separated channel pattern 206b and a part of the device isolation layer 214.

An insulating spacer 226 is formed on inner walls of the first groove 224. The insulating spacer 225 is formed of an insulating layer having an etch selectivity with respect to the device isolation layer 108a. For example, the insulating spacer 225 may be formed of a silicon nitride layer or a silicon oxynitride layer, the same as the mold layer 222. Due to the trimming process, the first groove 224 may expose the in-situ doped epitaxial pattern 218. In this case, the insulating spacer 226 covers the exposed doped in-situ doped epitaxial pattern 218.

The device isolation layer 214 is etched using the mold layer 222 and the insulating spacer 226 as a mask to form a second groove 227 shown in FIG. 10. The second groove 227 exposes fourth sidewalls of the separated channel pattern 206b, second sidewalls of the protruded channel pattern 210a, and sidewalls aligned with the second and fourth sidewalls of the channel interlayer pattern 204b. Specifically, it is preferable that the second groove 227 exposes an upper portion of the second sidewalls.

An isotropic etch process is performed to selectively remove the exposed channel interlayer pattern 204b. Accordingly, a bottom surface of the separated channel pattern 206b, a top surface of the protruded channel pattern 210a, and a tunnel 225 surrounded by the in-situ doped epitaxial patterns 218 are formed. Even if the channel interlayer pattern 204b is removed, the lattice width of the separated channel pattern 206b is maintained in a strained state. A gate insulating layer 228 is formed on the substrate 100 having the tunnel 225. The gate insulating layer 228 may be formed of a silicon oxide layer, in particular, a thermal oxide layer. A gate conductive layer 230 fills in the gate groove and the tunnel 225 is formed on the substrate 200. The gate conductive layer 230 may be a doped polysilicon or a conductive metal-contained material of low resistance. The conductive metal-contained material of low resistance may be formed of the same materials as in the embodiment shown in FIGS. 1-3. The gate conductive layer 230 is planarized until the mold layer 222 is exposed to form the gate electrode 230a, which is shown in FIGS. 11 and 12.

Otherwise, a process for removing the exposed channel interlayer pattern 204b may be omitted. Accordingly, the transistor shown in FIGS. 13 and 14 can be embodied. In this case, since the tunnel 225 is filled with the channel interlayer pattern 204b, the gate insulating layer 228' and the gate electrode 230a', which are shown in FIGS. 13 and 14, are sequentially formed.

A semiconductor device according to still another embodiment of the present invention is similar to the embodiment explained in FIGS. 10-12. This semiconductor device is different in that a plurality of separated channel patterns are placed over a protruded channel pattern. Accordingly, with the same elements as in the embodiment shown in FIGS. 10-12 indicating like references, the present embodiment will be described emphasizing its features.

Figure 20:
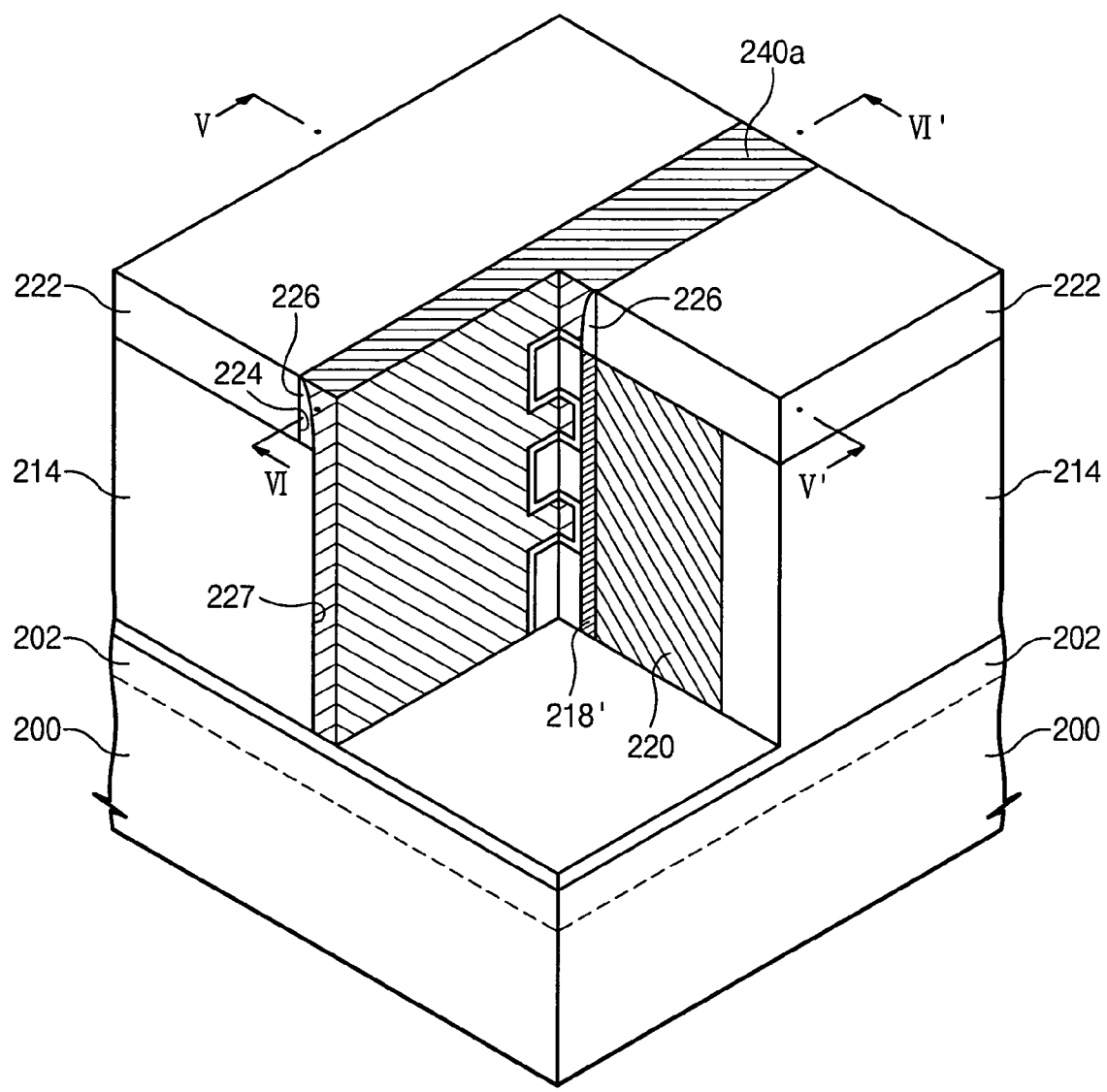
FIG. 20 is a perspective view showing a semiconductor device according to still another embodiment of the present invention.

FIG. 20 is a perspective view showing a semiconductor device according to still another embodiment of the present invention.

Referring to FIGS., 20, 21, and 22, a protruded channel pattern 210a is vertically extended from a substrate 200. A plurality of separated channel patterns 206b and 206b' are sequentially stacked over the protruded channel pattern 210a. The separated channel patterns 206 and 206b' are isolated from the protruded channel pattern 210a. In addition, the separated channel patterns 206 and 206b' are isolated with each other. In FIGS., 21 and 22, the first and second separated channel patterns 206b and 206b' are shown. Unlike this, three or more separated channel patterns 206b and 206b' may be placed as well.

A first tunnel 225 and at least one second tunnel 225' may be placed over the protruded channel pattern 210a. The first channel 225 is surrounded by a top surface of the protruded channel pattern 210a, a bottom surface of the first separated channel pattern 206b, and a pair of in-situ doped epitaxial patterns 218'. The second tunnel 225' is surrounded by top and bottom surfaces of neighboring isolated patterns 206b and 206' and the in-situ doped epitaxial patterns 218'.

The separated channel patterns 206*b* and 206*b*' may have the same height or have different respective vertical lengths.

The protruded channel pattern 210*a* and the separated channel pattern 206*b* and 206*b*' may be formed of materials the same as in the embodiment shown FIGS. 10-12. In particular, each of the separated channel patterns 206*b* and 206*b*' may be formed of a single crystalline semiconductor layer having lattice widths wider than the protruded channel pattern 210*a*, that is, a strained crystalline silicon.

The protruded channel pattern 210*a* has a pair of first sidewalls and a pair of second sidewalls, each sidewall of each pair facing each other, respectively. Each of the separated channel patterns 206*b* and 206*b*' has third sidewalls and fourth sidewalls, which are aligned with the first sidewalls and the second sidewalls, respectively.

A channel stop layer 202 may be placed under the substrate 200 of the protruded channel pattern 210*a*.

A pair of in-situ doped epitaxial patterns 218' is formed on the first sidewalls of the protruded channel pattern 210*a*, respectively. The in-situ doped epitaxial patterns 218' is vertically extended to be connected to third sidewalls of the separated channel patterns 206*b* and 206*b*'. The separated channel patterns 206*b* and 206*b*' are supported by the in-situ doped epitaxial pattern 218' to be isolated from the protruded channel pattern 210*a*. It is preferable that the in-situ doped epitaxial patterns 218' is a semiconductor layer formed by performing an in-situ doped epitaxial process, that is, a doped single crystalline silicon.

A conductive pattern 220 is placed on one sidewall of the in-situ doped epitaxial pattern 218' opposite the patterns 210*a*, 206*b* and 206*b*'. The conductive pattern 220 may be formed of a material the same as in the above-mentioned embodiments.

A device isolation layer 214 surrounding the patterns 210*a*, 206*b*, 206*b*', 218' and 110 is placed on the substrate 200. At this time, a top surface of the uppermost second separated channel pattern 206*b*', the in-situ doped epitaxial patterns 218' and the conductive patterns 220 is exposed. The mold layer 222 covers the device isolation layer 214 and the exposed patterns 206*b*', 218', and 220. The device isolation layer 214 and the mold layer 222 may be formed of a material the same as in the above-mentioned embodiments.

A first groove 224 is placed in the mold layer 222. The first groove 224 crosses the second separated channel pattern 206*b*' and exposes a part of the device isolation layer 214. An insulating spacer 226 is placed on inner walls of the first groove 224. The function and elements of the insulating spacer 226 may be the same as the above-mentioned embodiments.

A second groove 227 aligned with the first groove 224 is placed in the device isolation layer 214. Preferably, the second groove 227 is aligned with the insulating spacer. The second groove 227 exposes fourth sidewalls of the separated channel patterns 206*b* and 206*b*', and second sidewalls of the protruded channel pattern 210*a*. Needless to say, it is preferable that the second groove 227 exposes an upper portion of the second sidewalls. The first and second grooves 224 and 227 comprise a gate groove.

A gate electrode 240*a* is filled in the gate groove and tunnels 225 and 225'. In addition, a gate insulating layer 239 is interposed between the gate electrode 240*a* and the patterns 210*a*, 206*b*, 206*b*', and 218'. The gate electrode 240*a* and the gate insulating layer 238 may be formed of material the same as in the embodiment shown in FIGS. 10-12.

In the transistor with the above-mentioned structure, a channel region includes top and bottom surfaces and fourth sidewalls of a plurality of separated channel patterns 206*b* and 206*b*', and a top surface of second sidewalls of the protruded channel pattern 210*a*. Accordingly, the channel width of the transistor may be increased further. Additionally, the in-situ doped epitaxial pattern 218' is connected to the channel width in a conformal impurity concentration. As a result, a channel is formed at all regions of the channel width, and all channel lengths in the channel region may be conformal. Accordingly, a driving current of the transistor is dramatically increased in comparison with a conventional art, and an on-off characteristic of the transistor can be stabilized.

Tunnels 225 and 225' of the transistor may be filled with the gate electrode 240*a* as well as another material. This will be described referring to FIGS. 23 and 24.

Figure 23:
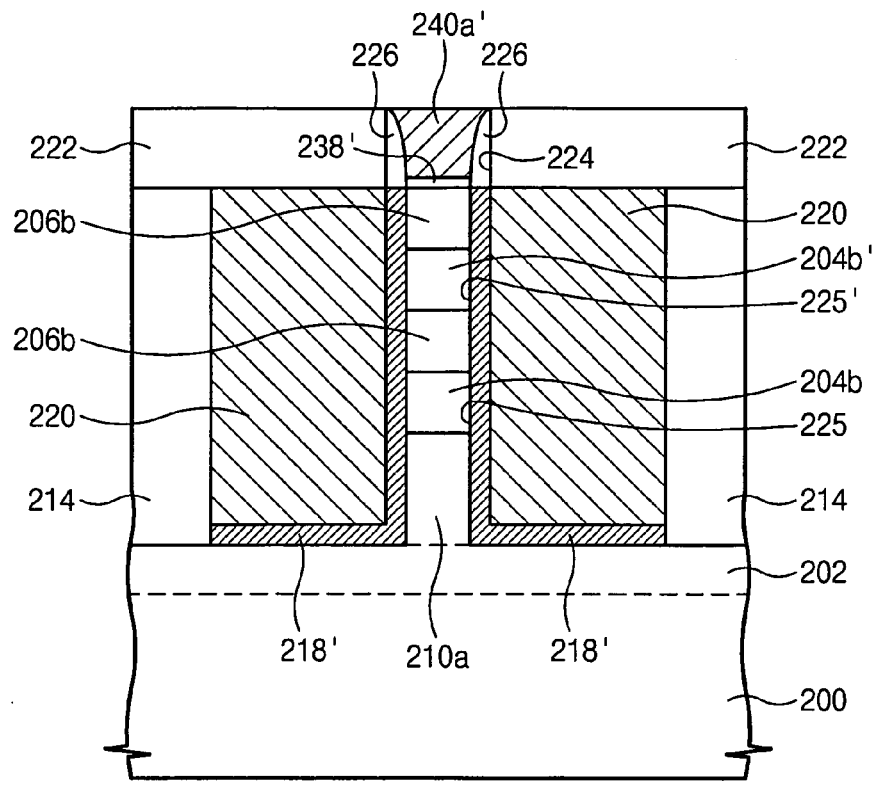
FIGS. 23 and 24 are cross-sectional views taken along line V-V' and VI-VI' of FIG. 20 for showing a modification example of the semiconductor device according to still another embodiment of the present invention, respectively.
Figure 24:
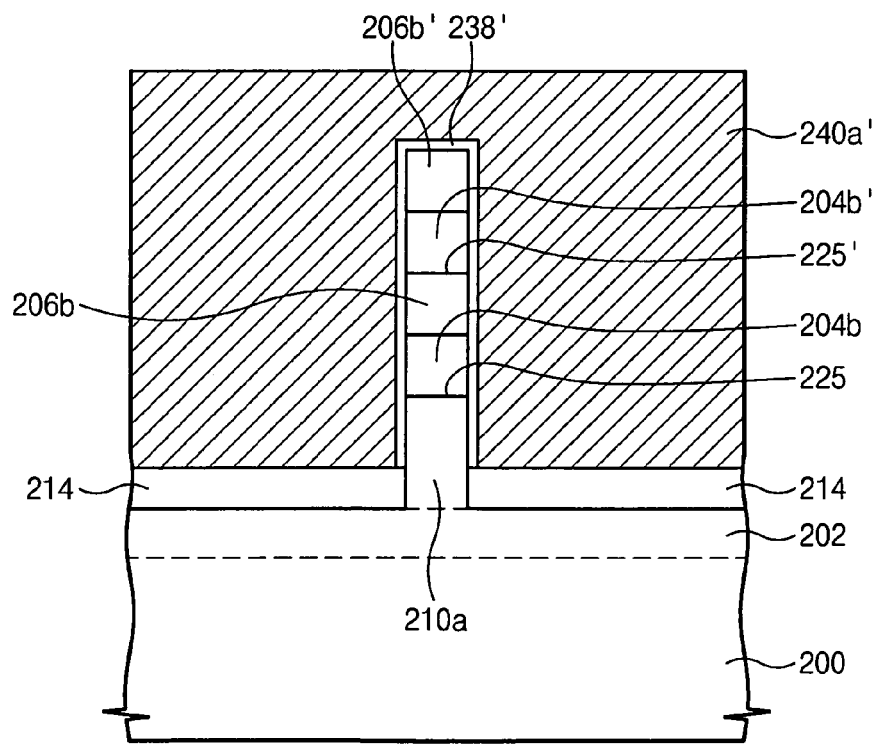

FIGS. 23 and 24 are cross-sectional views taken along lines V-V' and VI-VI', respectively, of FIG. 20 to show a modification example of the semiconductor device according to still another embodiment of the invention.

Referring to FIGS. 23 and 24, the first tunnel 225 is filled with a first channel interlayer pattern 204*b*, and at least one second tunnel 225' is filled with a second interlayer pattern 204*b*. Accordingly, a gate electrode 225' covers second sidewalls of a protruded tunnel pattern 210*a*, fourth sidewalls of isolated tunnel patterns 206*b* and 206*b*', and sidewalls that are aligned with the second and fourth sidewalls of channel interlayer patterns 204*b* and 204*b*'. A gate insulating layer 238' is interposed between the patterns 210*a*, 024*b*, 206*b*, 204*b*', and 206*b*, and the gate electrode 240*a*'.

The first and second channel interlayer patterns 204*b* and 204*b*' have a lattice width wider than the protruded channel pattern 210*a*. In addition, the first and second channel interlayer patterns 204*b* and 204*b*' are formed of a single crystalline semiconductor layer having an etch selectivity with respect to the protruded channel pattern 210*a* and the separated channel patterns 206*b* and 206*b*'. In particular, it is preferable that the first channel interlayer pattern 204*b* is formed of a single crystalline semiconductor layer that is gradually increased from a bottom surface to a top surface, and at least one second channel interlayer patterns 204*b*' is formed of a single crystalline semiconductor layer having a conformal lattice width throughout. For example, it is preferable that the first channel interlayer pattern 204*b* is formed of a silicon germanium layer. In this case the concentration of the silicon germanium layer is gradually increased from a bottom surface to a top surface. In addition, it is preferable that at least one second channel interlayer pattern 204*b*' is formed of a silicon germanium layer. In this case, the concentration of the silicon germanium layer is conformal throughout. It is preferable that the germanium concentration of the second channel interlayer pattern 204*b*' is the same as the maximum germanium concentration of the first channel interlayer pattern 204*b*.

The separated channel patterns 206*b* and 206*b*' are formed of a strained crystalline silicon having a lattice width wider than the protruded channel pattern 210*a*. At this time, the separated channel patterns 206*b* and 206*b*' may have the same lattice width as the second channel interlayer pattern 204*b*'.

As a result, the first interlayer channel pattern 204*b* buffers a stress due to a lattice difference between the first separated channel pattern 206*b* and the protruded channel pattern 210*a*. The second channel interlayer pattern 204*b*' performs a function to support a strained lattice width of the separated channel patterns 206*b* and 206*b*'.

In the transistor according to the above-mentioned modification, the mobility and amount of carriers in a channel region are increased, thereby increasing a driving current of the transistor further.

FIGS. 25A to 27A are cross-sectional views taken along line V-V' of FIG. 20 to illustrate a method of fabricating the semiconductor device according to yet another embodiment of the present invention. Also, FIGS. 25B to 27B are cross-sectional views taken along line VI-VI' of FIG. 20.

Figure 25A:
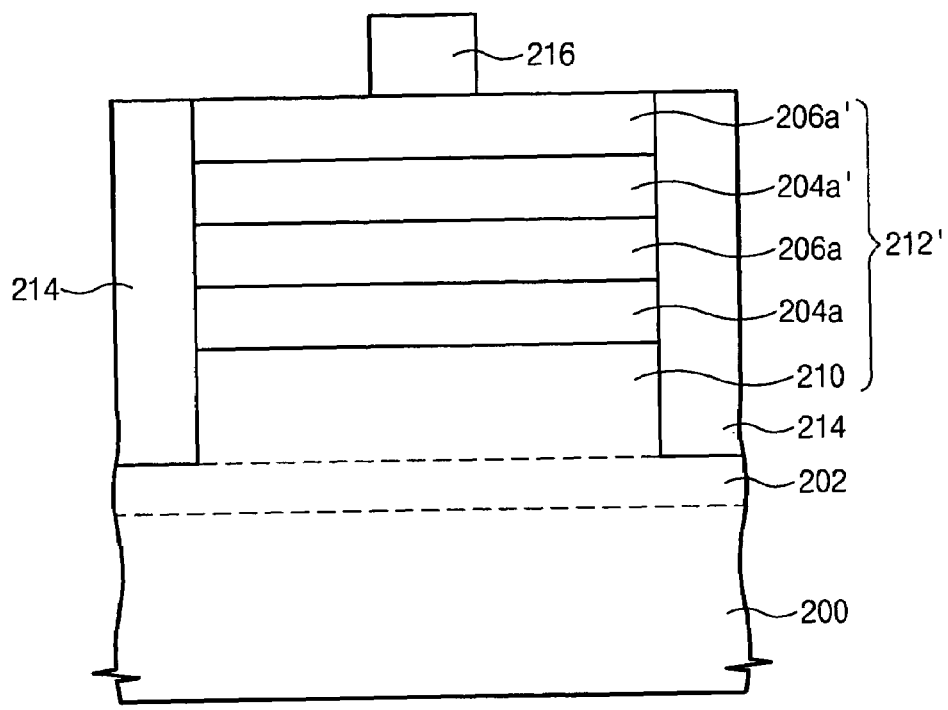
Figure 25B:
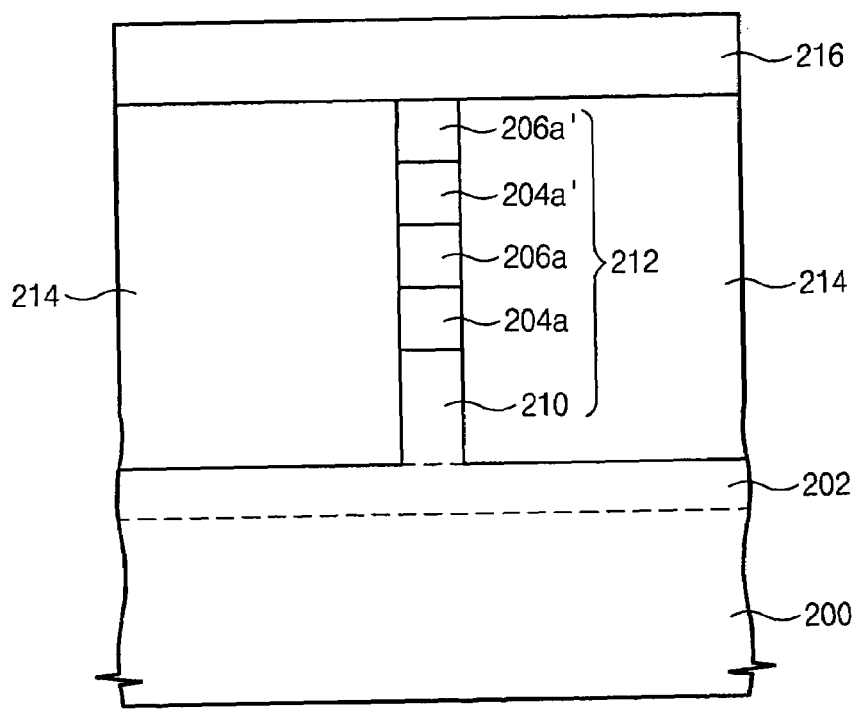
Figure 26A:
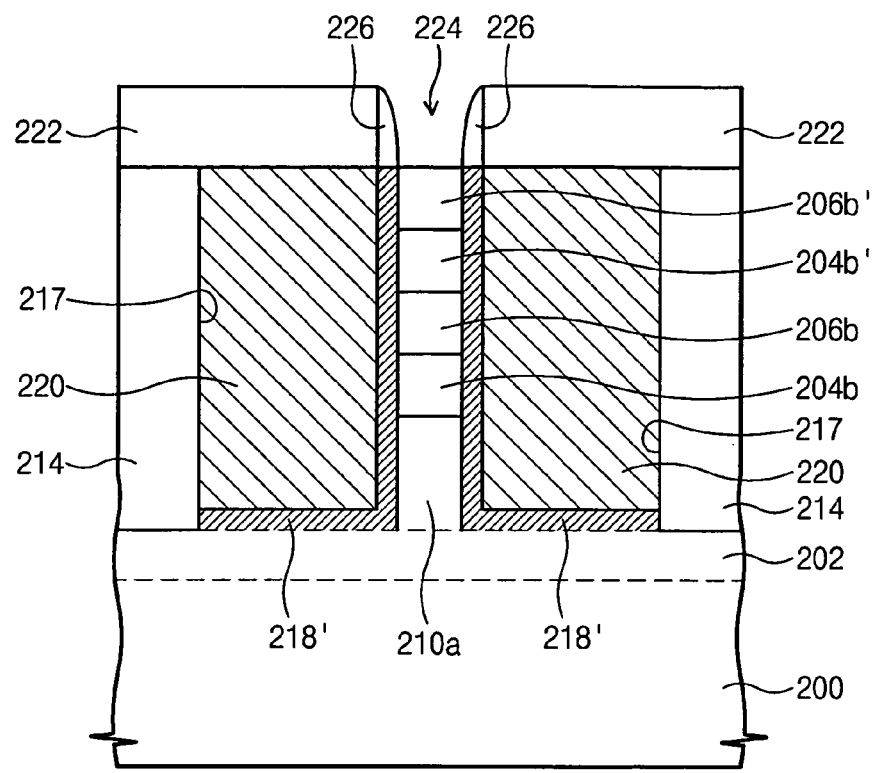
Figure 26B:
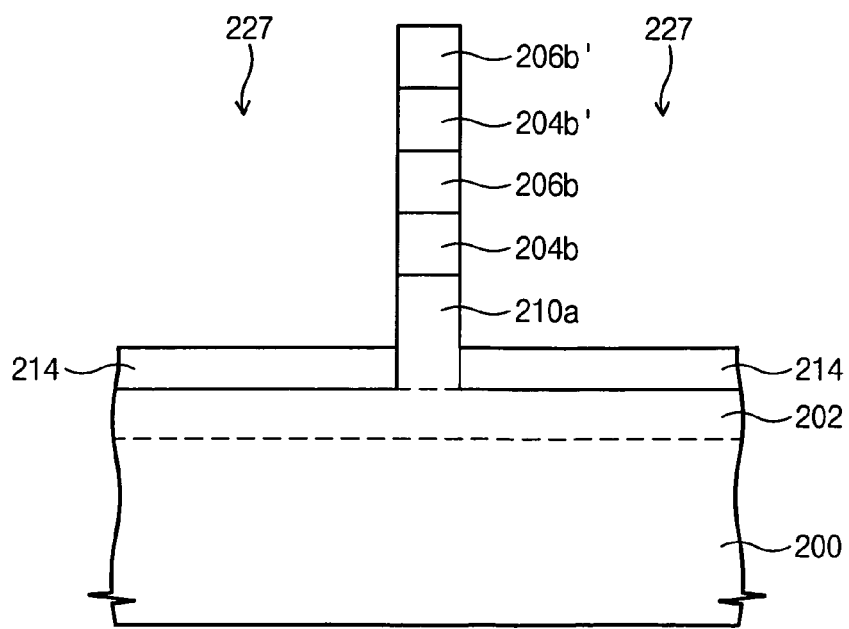
Figure 27A:
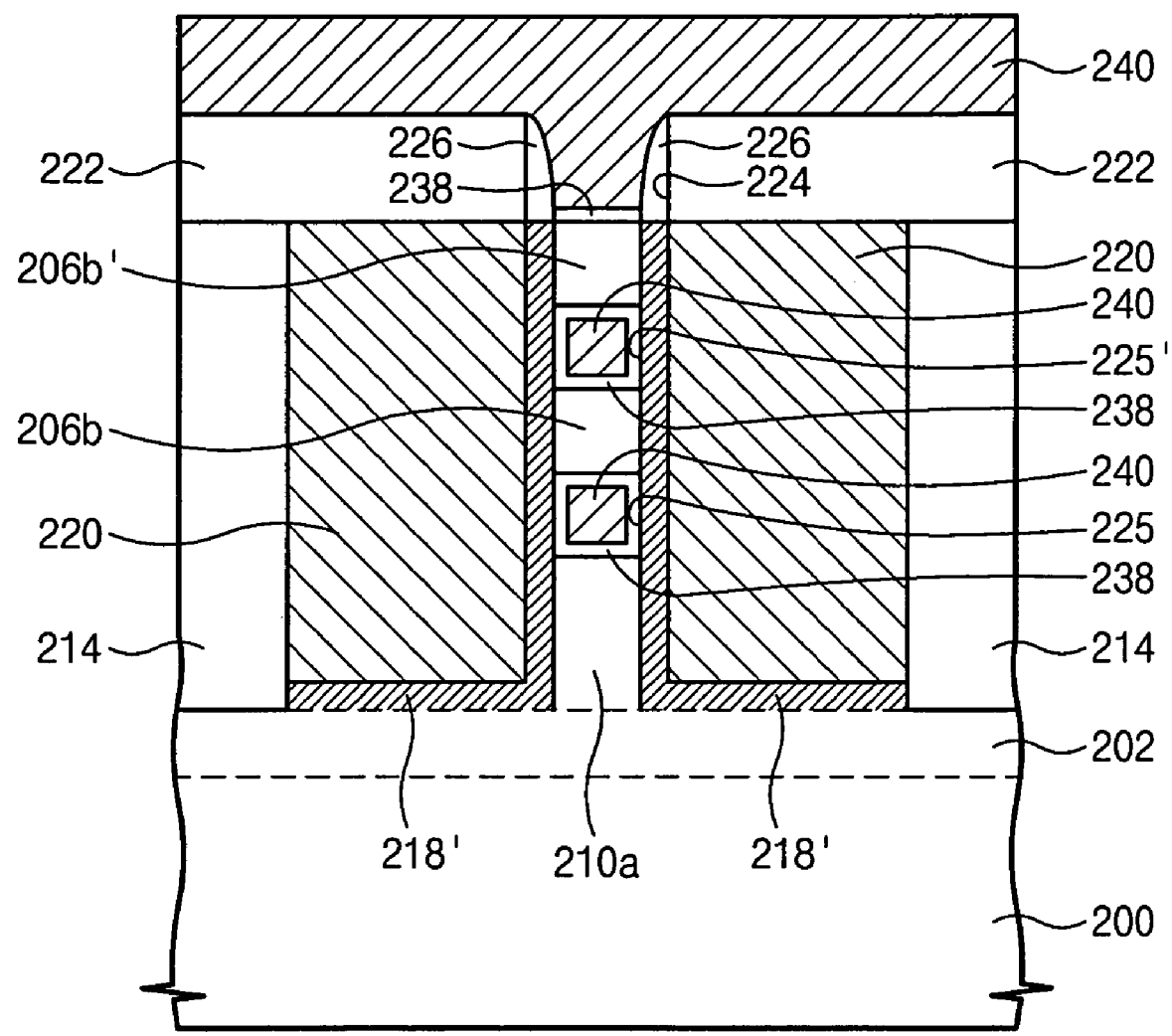
Figure 27B:
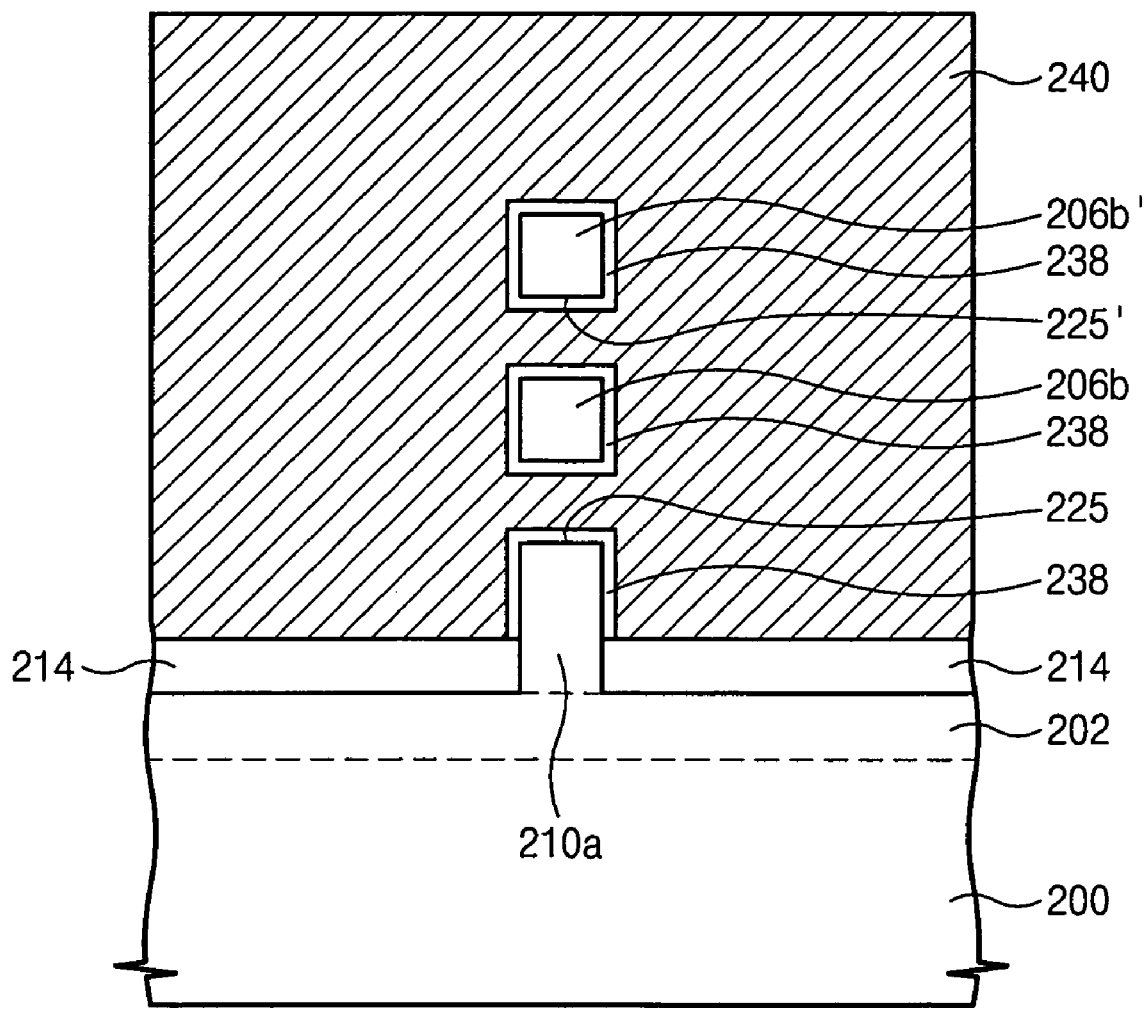

Referring to FIGS. 25A and 25B, a channel stop layer 202 is formed at a predetermined depth of the substrate 200.

A plurality of interlayer semiconductor layers 204a and 204a' and a plurality of channel semiconductor layers 206a and 206a' are alternately formed on the substrate 200. In FIGS. 25A and 25B, the first and second interlayer semiconductor layers 204a and 204a', and the first and second channel semiconductor layers 206a and 206a' are alternately formed. The first interlayer semiconductor layer 204a and the first channel semiconductor layer 206a are respectively equivalent to the lowermost layer of the plurality of interlayer semiconductor layers 204a and 204a', and the plurality of channel semiconductor layers 206a and 206a'. The second interlayer semiconductor layer 204a' and the second channel semiconductor layer 206a' may be formed on the first channel semiconductor layer 206a several times by turnings. Accordingly, a plurality of second interlayer semiconductor layers 204a' and a plurality of second channel semiconductor layers 206a' may be formed over the substrate 200. The channel semiconductor layers 206a and 206a', the interlayer semiconductor layers 204a and 204a', and the substrate 200 are successively patterned to form an active region 212' that is vertically extended from the substrate 200. The active region 212' may be formed using a hard mask pattern in the same way as the above-mentioned embodiment. The active region 212' includes a protruded portion 210 of the substrate, patterned interlayer semiconductor layers 204a and 204a', and patterned channel semiconductor layers 206a and 206a'. The patterned interlayer semiconductor layers 204a and 204a and the patterned channel semiconductor layers 206a and 206a' are stacked alternately.

The interlayer semiconductor layers 204a and 204a' have an etch selectivity with respect to the channel semiconductor layers 206a and 206a' and the substrate 200. Additionally, the interlayer semiconductor layers 204a and 204a' are formed of a single crystalline semiconductor layer having a lattice width wider than the protruded portion 210 of the substrate. Specifically, it is preferable that the first interlayer semiconductor layer 204a is formed of a single crystalline semiconductor layer. In this case, the lattice width of the single crystalline semiconductor layer is gradually increased from a bottom surface to a top surface. In addition, it is preferable that at least one second interlayer semiconductor layer 204b' is formed of a single crystalline semiconductor layer having a conformal lattice width throughout. The channel semiconductor layers 206a and 206a' are formed to have a lattice width wider than the protruded portion 210 of the substrate 210.

The first interlayer semiconductor layer 204a is formed on the substrate 200 using silicon source gases and germanium source gases and by performing an epitaxial growth process in which germanium source gases are gradually increased. Accordingly, the first interlayer semiconductor layer 204a is formed of a silicon germanium layer in which the lattice width is gradually increased. The first channel semiconductor layer 206b is formed on the first interlayer semiconductor layer 204b by performing an epitaxial growth process using only silicon source gases. As a result, the first channel semiconductor layer 206a is formed of a strained crystalline silicon due to a top surface of the first interlayer semiconductor layer 204a. The second interlayer semiconductor layer 204a' is formed on the first channel semiconductor layer 206a by performing an epitaxial growth process using silicon source gases and germanium source gases having a conformal concentration. As a result, the second interlayer semiconductor layer 204a' is formed of a silicon germanium layer having a conformal lattice width. At this time, it is preferable that germanium source gases having the conformal concentration are the same as the maximum amount of germanium source gases used in the first interlayer semiconductor layer 204a. The second channel semiconductor layer 206a' is formed by performing an epitaxial growth process using only silicon source gases. Accordingly, the second channel semiconductor layer 206a' is formed of a strained crystalline silicon. The first and second channel semiconductor layers 206a and 206a' may have the same lattice width.

A device isolation layer 214 surrounds sidewalls of the active region 212' on the substrate 200. At this time, a top surface of the active region 212' is exposed. A dummy gate pattern 216 crossing the active region 212' is formed on the device isolation layer 214. In the same material and in the same way as the above-mentioned embodiments, the device isolation layer 214 and the dummy gate pattern 216 may be formed.

Referring to FIGS. 26A, 26B, 27A, and 27B, the active region 212' is etched using the dummy gate pattern 216 as a mask to form a protruded channel pattern 210a, a first channel interlayer pattern 204b, a first separated channel pattern 206b, a second channel interlayer pattern 204b', and a second separated channel pattern 206b', which are sequentially stacked under the dummy gate pattern 216. At this time, a pair of gap regions 217, being an etched active region 212', are formed at both sides of the dummy gate pattern 216.

The gap region 217 exposes sidewalls of the patterns 210a, 204b, 2-6b, 204b', and 206b'. The protruded channel pattern 210a has a pair of first sidewalls exposed at the gap region 217 and a pair of second sidewalls perpendicular to the first sidewalls. Each of the separated channel patterns 206b and 206b' has third sidewalls aligned with the first sidewalls and fourth sidewalls aligned with the second sidewalls. The channel interlayer pattern 204b and 204b' have sidewalls that are aligned with the protruded and separated channel patterns 210a, 206b, and 206b'.

It is preferable that trimming is performed using an isotropic etch process having the same etch ratio with respect to the patterns 210a, 204b, 206b, 206b' 204b', and 206b'. Resultantly, the widths of the patterns 210a, 204b, 206b, 206b' 204b', and 206b' are reduced, and a surface of the sidewalls may be planarized.

In-situ doped epitaxial patterns 218' are formed on exposed sidewalls of the patterns 210a, 204b, 206b, 206b' 204b', and 206b' by performing an in-situ doped selectively epitaxial growth (SEG) process with respect to the substrate 100. It is preferable that the in-situ doped epitaxial pattern 218' is formed of a doped single crystalline silicon.

The following processes may be performed in the same way as the embodiment explained in FIGS. 10-12. In other words, a conductive pattern 220 filling in the gap region 217 is formed. A planarized mold layer 222 is formed so as to expose a top surface of the conductive pattern 220. The dummy gate pattern 216 is selectively removed. As a result, a first groove 224 is formed. A second groove 227 is formed by forming an insulating spacer 226 on inner walls of the first groove 224 and using the mold layer 222 and the insulating spacer 226 as a mask. At this time, the second groove 227 exposes second sidewalls and fourth sidewalls of the patterns 210a, 206b, and 206b', and sidewalls aligned with second and fourth sidewalls of the channel interlayer patterns 204b and 204b'. The first and second grooves 224a and 227 comprise a gate groove.

Figure 21:
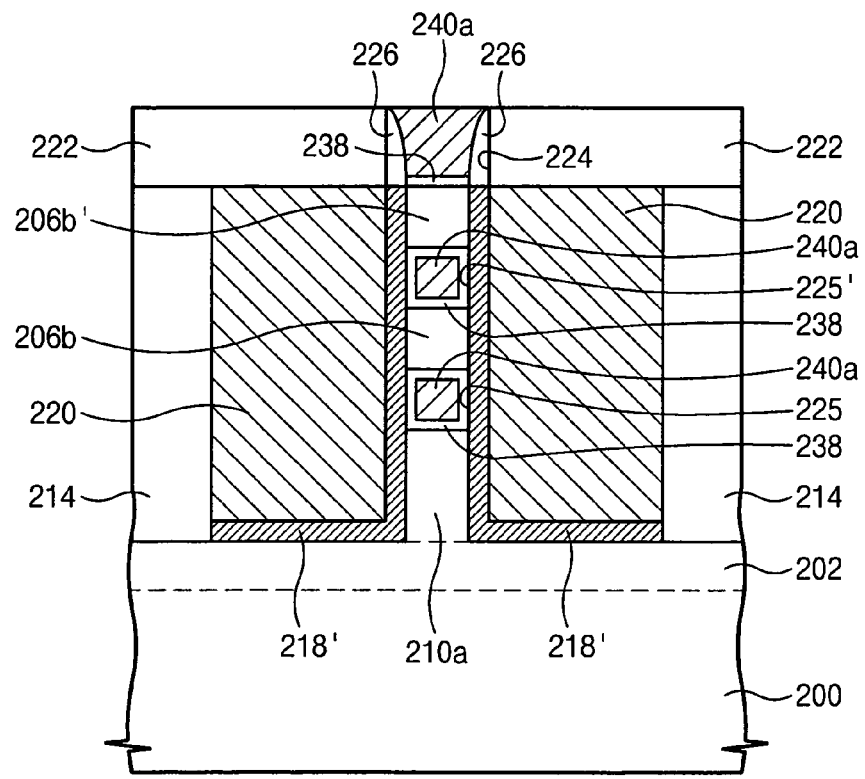
FIGS. 21 and 22 are cross-sectional views taken along line V-V' and VI-VI' of FIG. 20, respectively.
Figure 22:
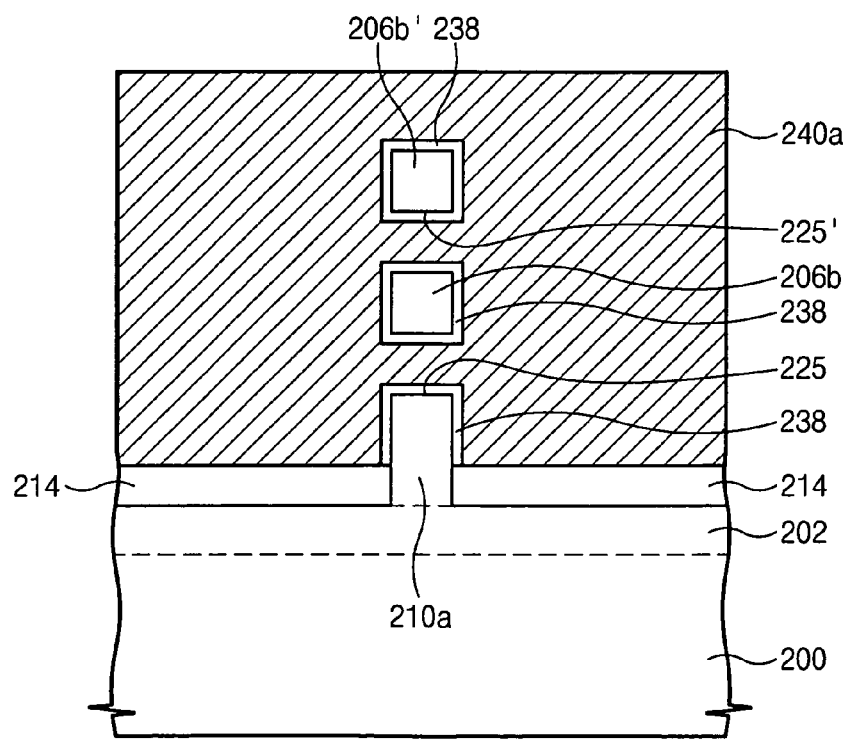

After selectively removing the exposed channel interlayer patterns 204b and 204b', a gate insulating layer 238 is formed on the substrate 200, and then a gate conductive layer 240 filling in the gate groove is formed on the substrate 200. The gate conductive layer 240 is planarized until the mold layer 222 is exposed so that a gate electrode 240a shown in FIGS. 21 to 22 is formed.

Even if a process for removing the exposed channel interlayer patterns 204b and 204b' is omitted, the transistor shown in FIGS. 23 and 24 can be embodied.

In the embodiments explained above, corresponding elements may be formed in the same material and in the same way.

As previously mentioned, in-situ doped epitaxial patterns having a conformal concentration throughout a channel pattern are formed at both sidewalls of the channel pattern that is protruded from a substrate, respectively. For this reason, all channel widths in a channel region of a transistor are connected to source/drain regions having a conformal concentration. As a result, a channel is formed in all channel widths in the channel region, and all channel lengths in the channel region may be conformal. For this reason, it is possible to maximize a driving current of the transistor, and an on-off characteristic can be stabilized.

In addition, at least one separated channel pattern is placed on an upper portion of the protruded channel pattern. The in-situ doped epitaxial patterns are vertically extended to be respectively connected to both sidewalls of the separated channel pattern. Accordingly, since a channel region of a transistor includes both sidewalls, and top and bottom surfaces of the separated channel pattern, the driving current of the transistor can be increased further.

Moreover, now that the separated channel pattern is formed of a single crystalline semiconductor layer having a lattice width wider than the protruded channel pattern, the mobility and amount of carriers in a channel region is increased, and thereby increasing the driving current of the transistor.

Furthermore, a trimming process for reducing the width of the channel patterns is performed, and an insulating spacer is formed on sidewalls of a groove formed at the gate electrode. As a result, a channel region of the transistor may be formed smaller as compared with the minimal line width that can be defined by a photolithography process. Resultantly, the transistor according to the present invention is suitable for high-integration of semiconductor devices.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A semiconductor device comprising:
    a channel pattern protruded from a substrate and having a pair of first sidewalls facing each other and a pair of second sidewalls facing each other;
    a pair of in-situ doped epitaxial semiconductor patterns respectively formed on the first sidewalls;
    a pair of conductive patterns, each of the pair respectively formed on each sidewall of the pair of the in-situ doped epitaxial semiconductor patterns opposite the protruded channel pattern;
    a gate electrode crossing the protruded channel pattern; and
    a gate insulating layer interposed between the gate electrode and the protruded channel pattern.

2. The semiconductor device of claim 1, further comprising:
    a device isolation layer placed on the substrate to surround the sidewalls of the protruded channel pattern; and
    a mold layer covering the protruded channel pattern, the pair of in-situ doped epitaxial semiconductor patterns, the pair of conductive patterns, and the device isolation layer,
    wherein the gate electrode is placed within a first groove in the mold layer and a second groove in the device isolation layer, wherein the first groove crosses the protruded channel pattern, and wherein the second groove is aligned with the first groove and exposes at least an upper portion of the second sidewalls.

3. The semiconductor device of claim 2, further comprising an insulating spacer interposed between inner walls of the first groove and the gate electrode, wherein the insulating spacer is formed on the inner walls of the first groove, and wherein the second groove is aligned with the insulating spacer.

4. The semiconductor device of claim 1, further comprising a channel stop layer formed in the substrate beneath the protruded channel pattern.

5. The semiconductor device of claim 1, wherein the epitaxial semiconductor patterns are single crystalline silicon.

6. A semiconductor device comprising:
    a channel pattern protruded from a substrate and having a pair of first sidewalls facing each other and a pair of second sidewalls facing each other;
    a pair of in-situ doped epitaxial patterns respectively formed on the first sidewalls;
    a pair of conductive patterns, each of the pair respectively formed on each sidewall of the pair of the in-situ epitaxial patterns opposite the protruded channel pattern;
    a gate electrode crossing the protruded channel pattern;
    a gate insulating layer interposed between the gate electrode and the protruded channel pattern;
    a device isolation layer placed on the substrate to surround the sidewalls of the protruded channel pattern; and
    a mold layer covering the protruded channel pattern, the pair of in-situ doped epitaxial patterns, the pair of conductive patterns, and the device isolation layer,
    wherein the gate electrode is placed within a first groove in the mold layer and a second groove in the device isolation layer, wherein the first groove crosses the protruded channel pattern, and wherein the second groove is aligned with the first groove and exposes at least an upper portion of the second sidewalls.

7. The semiconductor device of claim 6, further comprising an insulating spacer interposed between inner walls of the first groove and the gate electrode, wherein the insulating spacer is formed on the inner walls of the first groove, and wherein the second groove is aligned with the insulating spacer.

* * * * *